(12) United States Patent
Guido et al.

(10) Patent No.: US 8,010,722 B2
(45) Date of Patent: Aug. 30, 2011

(54) ANALOG COMPARATORS IN A CONTROL SYSTEM

(75) Inventors: Samuel J. Guido, Dearborn, MI (US);
Jeremy W. Brodt, Plano, TX (US);
Jeffrey T. Sieber, Livonia, MI (US)

(73) Assignee: Renesas Electronics America Inc., Santa Clara, CA (US)

( * ) Notice: Subject to any disclaimer, the term of this patent is extended or adjusted under 35 U.S.C. 154(b) by 106 days.

(21) Appl. No.: 12/622,609

(22) Filed: Nov. 20, 2009

(65) Prior Publication Data

US 2010/0109733 A1    May 6, 2010

Related U.S. Application Data

(63) Continuation-in-part of application No. 12/264,538, filed on Nov. 4, 2008.

(51) Int. Cl.
*G06F 13/12* (2006.01)
*H03M 1/00* (2006.01)

(52) U.S. Cl. .......................... 710/69; 340/110
(58) Field of Classification Search .............. 710/69–70; 341/110; 327/100
See application file for complete search history.

(56) References Cited

U.S. PATENT DOCUMENTS

| | | | | |
|---|---|---|---|---|
| 4,442,511 A | * | 4/1984 | Meer et al. | 367/78 |
| 5,555,452 A | * | 9/1996 | Callaway et al. | 455/226.2 |
| 5,995,033 A | * | 11/1999 | Roeckner et al. | 341/155 |
| 6,008,749 A | * | 12/1999 | Smith | 341/163 |
| 2006/0013485 A1 | * | 1/2006 | Nitta et al. | 382/194 |
| 2008/0137777 A1 | * | 6/2008 | Behzad et al. | 375/319 |
| 2010/0109733 A1 | * | 5/2010 | Guido et al. | 327/215 |

* cited by examiner

*Primary Examiner* — Christopher B Shin

(74) *Attorney, Agent, or Firm* — Campbell Stephenson LLP

(57) ABSTRACT

An apparatus is disclosed that includes first and second circuits coupled together via a bus, an input pin configured to receive an analog input signal, a digital-to-analog (DAC) convertor configured to convert a multibit reference signal into an analog reference signal, a comparator circuit coupled to the bus, an output of the DAC and to the input pin. The comparator circuit is configured to receive the analog reference signal from the DAC and the analog input signal, and configured to generate a first digital signal set to a first state if the analog reference signal is greater in magnitude than the analog input signal, or set to a second state if analog reference signal is lower in magnitude than the analog input signal. The comparator circuit is also configured to transmit the first digital signal to the first circuit via the bus. The first circuit in turn is configured to receive the first digital signal. In response to receiving the first digital signal, the first circuit is configured to generate a second digital signal set to the first or second state depending on whether the received first digital signal is set to the first or second state. The second circuit is configured to receive the second digital signal from the first circuit via the bus.

19 Claims, 20 Drawing Sheets

ANALOG COMPARATORS IN A CONTROL SYSTEM

CROSS-REFERENCE TO RELATED APPLICATIONS

This application is a continuation-in-part of U.S. patent application Ser. No. 12/264,538; filed on Nov. 4, 2008; entitled "Digital I/O Signal Scheduler," naming Samuel J. Guido, Jeremy W. Brodt, and Jeffrey T. Sieber as inventors, and is incorporated by reference herein in its entirety and for all purposes.

BACKGROUND OF THE INVENTION

Modern control systems are growing in application and complexity. There are many classes of control systems, with many variations and combinations. Some control systems generate signals that control components. For example, some automobile engine control systems generate signals that directly or indirectly control various components (e.g., spark plugs, fuel injectors, etc.) of an internal combustion engine. The present invention will be described with reference to an automobile engine control system, it being understood that the present invention should not be limited thereto.

The simplest engine control systems only control the timing and quantity of fuel injected into each cylinder during each cycle of the engine. More advanced engine control systems found in modern cars also control ignition timing, variable valve timing, the level of boost maintained by a turbo charger, etc. Using a complex set of algorithms, engine control systems can determine the quantity and timing of fuel injected into cylinders, ignition timing, and other needed parameters by monitoring the engine through sensors that include, for example, a manifold absolute pressure sensor, throttle position sensor, air temperature sensor, oxygen sensor, etc.

SUMMARY OF THE INVENTION

An apparatus is disclosed that that includes first and second circuits coupled together via a bus, an input pin configured to receive an analog input signal, a digital-to-analog (DAC) convertor configured to convert a multibit reference signal into an analog reference signal, a comparator circuit coupled to the bus, an output of the DAC and to the input pin. The comparator circuit is configured to receive the analog reference signal from the DAC and the analog input signal, and configured to generate a first digital signal set to a first state if the analog reference signal is greater in magnitude than the analog input signal, or set to a second state if analog reference signal is lower in magnitude than the analog input signal. The comparator circuit is also configured to transmit the first digital signal to the first circuit via the bus. The first circuit in turn is configured to receive and process the first digital signal. In response to receiving and processing the first digital signal, the first circuit is configured to generate a second digital signal set to the first or second state depending on whether the received first digital signal is set to the first or second state. The second circuit is configured to receive the second digital signal from the first circuit via the bus.

BRIEF DESCRIPTION OF THE DRAWINGS

The present invention may be better understood in its numerous objects, features, and advantages made apparent to those skilled in the art by referencing the accompanying drawings.

The use of the same reference symbols in different drawings indicates similar or identical items.

DETAILED DESCRIPTION

The present invention relates to a control system. For purposes of explanation only, the present invention will be described with reference to a control system for controlling an automobile engine. More particularly, the present invention will be described with reference to a control system that directly or indirectly controls multiple components of an automobile engine such as fuel injectors, spark plug coils, etc., it being understood that the present invention may also find application in controlling components of other devises such transmissions, boat engines, motors employed in manufacturing equipment, internal combustion engines that generate electricity for driving an electric motor of an automobile, etc.

Control System Overview

Figure 1:
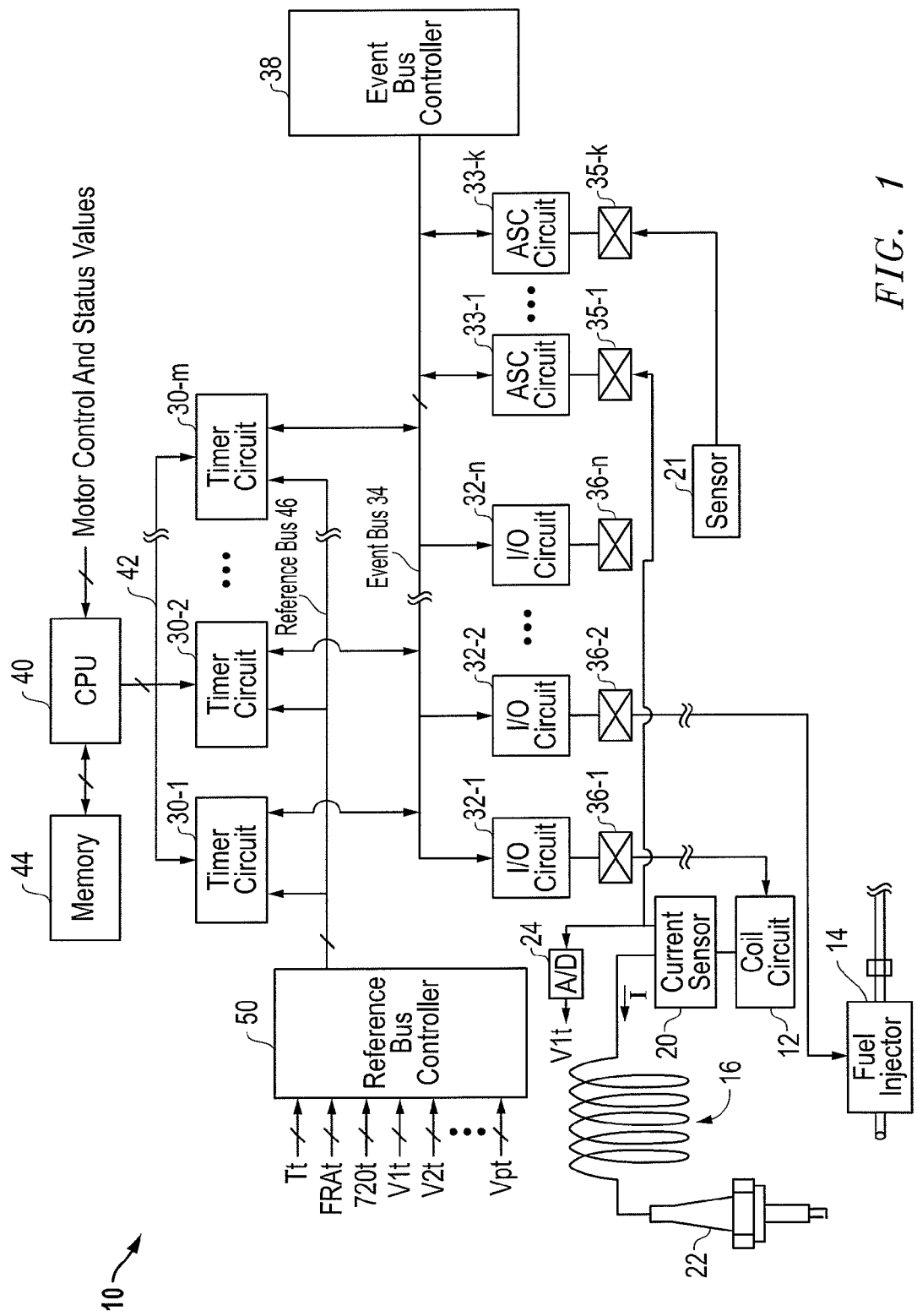
FIG. 1 illustrates in block diagram form, relevant components of an example control system.

FIG. 1 illustrates in block diagram form, relevant components of an example control system 10. The various components of the control system 10 shown in FIG. 1 may be implemented as one or more integrated circuits formed on one or more integrated circuit substrates. When implemented on separate substrates, the integrated circuits can be coupled together using electrically conductive traces on a printed circuit board. The term coupled should not be limited to a direct connection between components; two devices can be coupled together via one or more intervening devices.

Control system 10 generates control signals that control respective engine components. For example, control system 10 generates a one-bit control signal for controlling a coil circuit 12, which in turn controls the flow of current into a spark plug coil 16. Control system 10 also generates another one-bit control signal for controlling a fuel injector 14, which in turn controls the flow of fuel into an engine cylinder (not shown). The example one-bit control signal that controls coil circuit 12 will hereinafter be referred to as the "spark signal," and the example one-bit control signal that controls fuel injector 14 will hereinafter be referred to as the "fuel signal."

The present invention will be described with reference to control system 10 generating spark and fuel signals. However the example control system 10 can generate several additional spark signals for controlling respective coil circuits, several additional fuel signals for controlling respective fuel injectors, and several other control signals for controlling other engine components (not shown). Further, while the present invention will be described with reference to control system 10 generating one-bit control signals, it is understood the present invention should not be limited thereto. In another embodiment, multibit control signals may be generated for controlling components that operate in more than two modes. Single bit signals, such as the exemplary spark or fuel signal, are either "ON" (i.e., asserted, active or has voltage level equal to Vdd) or "OFF" (i.e., unasserted, inactive or a voltage level equal to ground).

With continuing reference to FIG. 1, coil circuit 12 controls current flow to coil 16, which in turn is coupled to a spark plug 22. Coil circuit 12 selectively provides current for charging coil 16, which in turn provides the energy that is used by spark plug 22 for creating a spark within an engine cylinder (not shown). When the spark signal is ON, current flows into coil 16, and when the spark signal is OFF, no current flows into coil 16.

Current sensor 20 generates an analog signal representing the quantity of current I flowing into coil 16. At regularly scheduled times, analog/digital convertor 24 samples and converts this analog signal into a multibit digital value V1$t$. Use of the letter "t" indicates the value changes over time. Thus, V1$t$ is a multibit value representing the quantity of current flowing into coil 16. V1$t$ is provided back to control system 10, and the state of the spark signal generated by control system 10, may depend on V1$t$ as will be more fully described below.

In addition to generating the spark signal, control system 10 may generate the fuel signal for controlling fuel injector 14. In response to receiving the fuel signal, fuel injector 14 selectively injects fuel into an engine cylinder (not shown). When the fuel signal is ON, injector 14 injects fuel into its cylinder, and when the fuel signal is OFF, injector 14 does not inject fuel into the cylinder. Coil circuit 12 and fuel injector 14 are examples of many different types of components that can be controlled by control system 10.

With continuing reference to FIG. 1, control system 10 includes timer circuits 30 coupled to each other, I/O circuits 32, and analog signal comparator (ASC) circuits 33 via event-bus 34. I/O circuits 32 and ASC circuits 33 are coupled to I/O pins 35 and 36 as shown.

Event-bus 34 is controlled by an event-bus controller 38, which will be more fully described below. As will be more fully described below, event-bus 34 may take form in serial and parallel sub-buses, it being understood the present invention should not be limited thereto.

FIG. 1 shows a single event-bus 34 that couples all timer circuits 30, I/O circuits 32, and ASC circuits 33. In an alternative embodiment, two or more event-buses may be used to couple selective timer circuits 30, I/O circuits 32, and ASC circuits 33. For example a one event-bus (not shown) could couple timer circuits 30-1-30-10, I/O circuits 32-1-32-5 and ASC circuits 33-1-33-3, while a another event-bus (not shown) could couple timer circuits 30-11-30-20, I/O circuits 32-6-32-8 and ASC circuits 33-3-33-6. Alternatively, one event-bus (not shown) could couple timer circuits 30-1-30-8 and I/O circuits 32-1-32-4, while another event-bus (not shown) could couple timer circuits 30-9-30-40, I/O circuits 32-5-32-8 and ASC circuits 33-1-33-5. In these alternative embodiments, each event-bus may be controlled by a respective event-bus controller. The present invention, however, will be described with reference to a single event-bus 34 and a single event-bus controller 38 as shown in FIG. 1.

Timer circuits 30, I/O circuits 32, and ASC circuits 33 are programmable. When programmed, timer circuits 30 generate one-bit event-signals, which are selectively transmitted to each other and to I/O circuits 32 via event-bus 34. Likewise, ASC circuits 33 when programmed generate one-bit event-signals, which are selectively transmitted to timer circuits 30 via event-bus 34. An event-signal, as its name implies, indicates that some event has occurred, should occur, or is occurring. For example, an event-signal ES-5 may indicate that current I supplied to coil 16 has exceeded a predetermined value, while an event-signal ES-20 may indicate that fuel injector 14 should inject fuel into its engine cylinder. An event-signal is either ON or OFF.

Event-signals can be transmitted concurrently with respective multibit event identifiers (event-IDs). Alternatively, event-signals can be transmitted after transmission of respective multibit event-IDs. The present invention will be described with reference to concurrent transmission of event-signals and their respective multibit event-IDs.

When a timer circuit (e.g., timer circuit 30-1) transmits its event-signal (e.g., event-signal "ES-1"), the timer circuit may concurrently transmit a respective event-ID (e.g., event-ID "SPARK") to the other timer circuits and to the I/O circuits 32 via event-bus 34. Likewise, when an ASC circuits 33 (e.g., ASC circuit 33-1) transmits its event-signal (e.g., event-signal "ES-1"), the ASC circuit 33 may concurrently transmit a respective event-ID (e.g., event-ID "MAX") to the timer circuits 33 via event-bus 34. There is a one-to-one mapping of event-IDs to event-signals. An event-ID, as its name implies, identifies its respective event-signal. In the embodiment shown in FIG. 1, event-bus 34 transmits one event-signal/event-ID pair at a time. When more than one event-bus is used in the alternative embodiment briefly described above, the event-buses may simultaneously transmit respective event-signals/event-ID pairs. Again, the present invention will be described with reference to a single event-bus 34.

While an event-signal and its respective event-ID may be concurrently transmitted to all timer circuits 30 and I/O circuits 32, one, some, none, or all of the timer circuits 30 and I/O circuits 32 may ignore the event-signal as will be more fully described below. Importantly, I/O circuits 32 can generate control signals, such as the spark signal and the fuel signal mentioned above, as a function of event-signals as will be more fully described below. Also, the state of one timer circuit's event-signal (e.g., ES-1) may be affected by the state of another timer circuit's event-signal (e.g., ES-5) and/or by the state of an ASC circuit 33's event-signal as will be more fully described below.

Control system 10 includes a device for programming or reprogramming timer circuits 30, I/O circuits 32, and ASC circuits 33. In the illustrated example, this programming device is a central processing unit (CPU) 40, which is in data communication with timer circuit 30, I/O circuits 32, and ASC circuits 33 via communication path 42, although FIG. 1 does not show CPU 40 in data communication with I/O circuits 32 and ASC circuits 33. CPU 40 programs or reprograms timer circuits 30, I/O circuits 32 and/or ASC circuits 33 via communication path 42. Although not shown communication path 42 may include many distinct components including, for example, memory management units, crossbars, bridges, direct memory access controllers, etc., to facilitate the transfer of programming values to timer circuits 30, I/O circuits 32 and/or ASC circuits 33. It should be noted that CPU 40 may also program other devices not shown in FIG. 1.

CPU 40 programs or reprograms timer circuits 30, I/O circuits 32 and ASC circuits 33 with digital values such as operational parameters, input-exception codes (IE codes), comparator values, or event-IDs. As will be more fully described below, timer circuits 30, I/O circuits 32 and ASC circuits 33 operate according to their programmed values (e.g., operational parameters, comparator values, IE codes, or event-IDs). CPU 40 generates one or more operational parameters and/or comparator values as a function of multibit engine control and/or status values such as engine speed, engine load, etc. More particularly, CPU 40 processes engine control and/or status values to generate operational parameters and/or comparator values in accordance with software instructions stored within memory 44. CPU 40 also selects IE codes, additional operational parameters, additional comparator values or event-IDs for the timer circuits 30 and I/O circuits 32 in accordance with the software instructions that CPU 40 executes. The software instructions also give CPU 40 the intelligence to decide which of the timer circuits 30, I/O circuits 32 and ASC circuits 33 are to be programmed or reprogrammed.

Timer circuits 30 are programmed or reprogrammed when they receive and store operational parameters, IE codes, and event-IDs. CPU 40 may reprogram some or all of timer circuits 30 with replacement operational parameters, IE codes, or event-IDs as CPU 40 receives and processes new engine control and/or status signals. Any one of the timer circuits 30 can operate in any one of many different ways depending on the operational parameters and IE codes they receive and store. In the embodiment shown, I/O circuits 32 and ASC circuits 33 are not programmed with operational parameters or IE codes.

Control system 10 shows timer circuits 30 coupled to a reference-bus controller 50 via a reference-bus 46. As will be more fully described below, reference-bus controller 50 transmits multibit reference values (e.g., V1$t$ from A/D convertor 24) in sequential order to some or all timer circuits 30 via reference-bus 46. The reference values typically change over time in magnitude. The state of an event-signal generated by a timer circuit 30 may depend on one or more reference values as will be more fully described below. It is noted reference-bus 50 may take form in one or more serial or parallel sub-buses. For the purposes of explanation only, it will be presumed that reference-bus 46 takes form in a parallel data bus.

In the example embodiment of FIG. 1, reference-bus controller 50 captures and subsequently transmits three different types of reference values including (1) one or more time domain reference values, (2) one or more angle domain reference values, and (3) one or more sensor domain reference signals, it being understood that the present invention could be implemented with fewer or more than three different types of reference values. For the purposes of explanation only, the present invention will be described with reference-bus controller 50 capturing and subsequently transmitting (1) at least one time domain reference value Tt (2) at least two angle domain reference values FRAt and 720At, and (3) p sensor domain reference values V1$t$-Vpt. Reference values change in value over time. It should be noted that angle domain references are not limited to FRAt and 720At.

Figure 2:
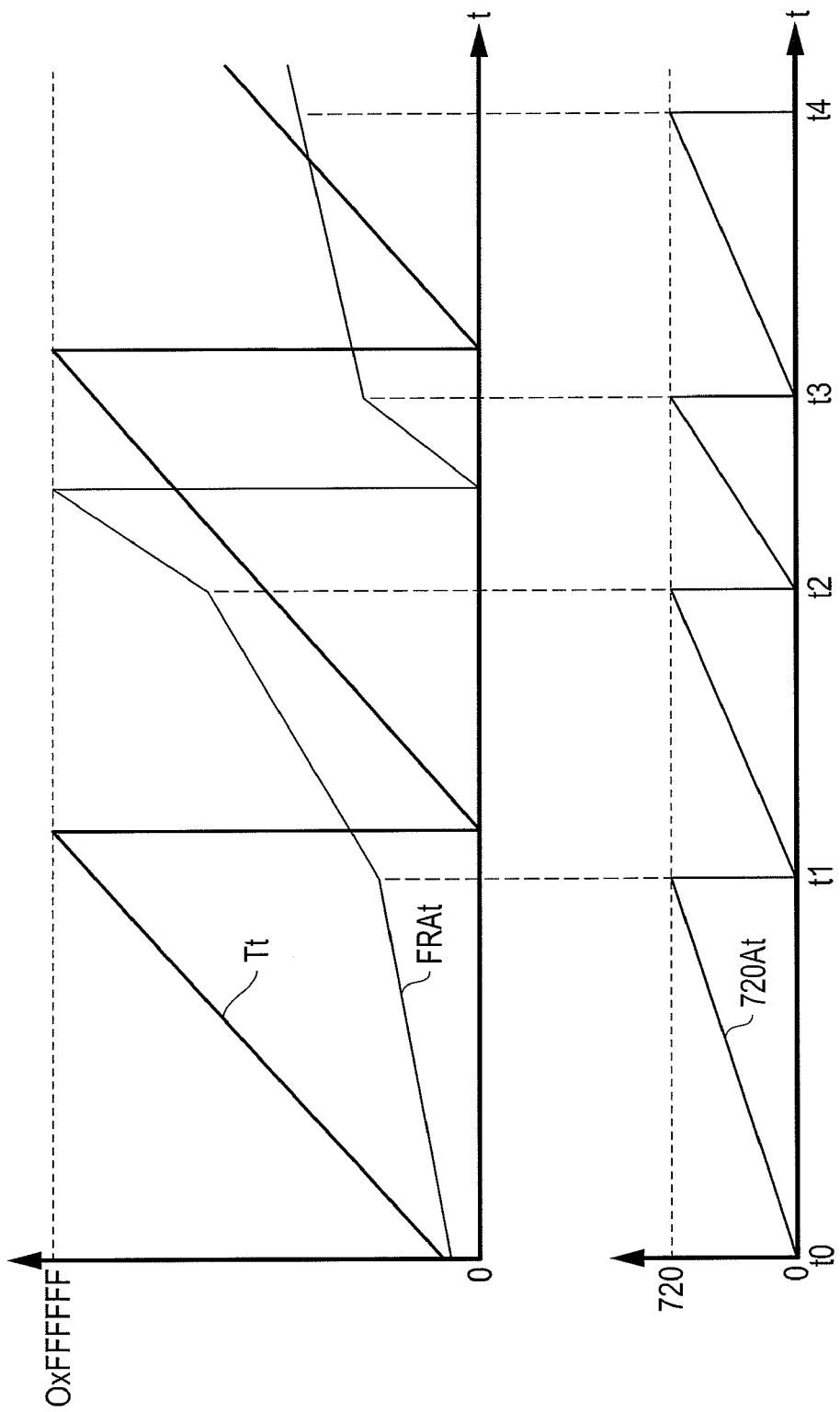
FIG. 2 is a timing diagram that illustrates example reference values that are received by the reference-bus controller of the control system shown in FIG. 1.

In the illustrated embodiment, time domain reference value Tt will take form in a multibit output value of a sequential counter (not shown) at time t. The counter increments Tt by 1 with each cycle or half cycle of a square wave clock signal input. FIG. 2 is a timing diagram that illustrates an exemplary Tt. The counter begins with Tt set to 0 and increments Tt by 1 with each full or half clock cycle until Tt reaches a predetermined value (e.g., 0xFFFFFF). Thereafter Tt returns to 0 and continues incrementing as shown. It is noted that the square wave clock signal used by the counter may be a system clock provided to and used by each of the components of control system 10 shown in FIG. 1.

FRAt (also known as the free running angle) and 720At (also known as the 720 angle) are multibit angle domain reference values. 720At relates to an angular position of an engine cycle at time t. Reference values FRAt and 720At may be generated as a function of a variable reluctance sensor (not shown) output. A number of equally-spaced and equally-sized teeth are formed around a crankshaft (not shown); two of the teeth, however, have a different distance between them. The sensor is located in proximity and senses the teeth as they pass. A processor (not shown) generates a predetermined number of "ticks" between sensed teeth based on the sensor output. These ticks represent the resolution of the angle reference values FRAt and 720At. Ticks may have a resolution of 0.1 degree, 0.25 degree, 0.5 degree, etc., of crankshaft rotation. When a tooth is sensed, the period from the just previously sensed tooth, is used to generate ticks for the currently sensed tooth. Since acceleration and deceleration of the crankshaft can cause a tooth period to be longer or shorter than the previous tooth period, the processer ensures the correct number of ticks is produced for each tooth. This is done by incrementing ticks quickly or by stopping them until the next tooth is sensed. The two teeth that have a different distance between them, as noted above, are used to identify a full rotation of the crankshaft.

The ticks are provided to an angle reference value generator (not shown) that generates the angle reference values FRAt and 720At. The timing diagram of FIG. 2 graphically illustrates exemplary angle domain reference values FRAt and 720At. Free running angle reference value FRAt is a multibit value between 0 and a predetermined number (e.g., 0xFFFFFF). FRAt may take form in the output of a first counter that increments with each tick or with each of a set number of ticks it receives. The first counter increments FRAt by 1 until it reaches 0xFFFFFF. Thereafter FRAt returns to 0 and continues incrementing as shown in FIG. 2. 720 angle reference value 720At is a multibit value representing a value between 0 and 720. 720At may take form in the output of a second counter that increments with each tick or with each of a set number of ticks it receives. The second counter increments 720At by 1 until it reaches 720. Thereafter 720At returns to 0 and continues incrementing as shown in FIG. 2. The second counter operates in cycles, and in each cycle 720At increments from 0 to 720. The 720 angle reference 720At increments from 0 to 720 with two full rotations of the crankshaft, which is often referred to as a full engine cycle.

When the crankshaft rotation of speed increases or decreases, the rate at which the angle domain reference values increment increase or decrease proportionally. To illustrate, assume the crankshaft rotates at a faster speed during the time period between t1 and t2 when compared to the time period between t0 and t1. FIG. 2 shows that during the time period between t1 and t2, 720At increments at a rate that is greater than the rate it increments during the time period between t0 and t1.

V1t-Vpt are referred to herein as sensor domain reference values, which are multibit digital equivalents of respective analog signals generated by, for example, various sensors within the engine at time t. For example, reference value V1t is a multibit digital signal equivalent of the analog signal generated by current sensor 20 (see FIG. 1), which in turn represents the quantity of current I flowing into coil 16 at time t.

Reference-Bus and Reference-Bus Controller

Figure 3:
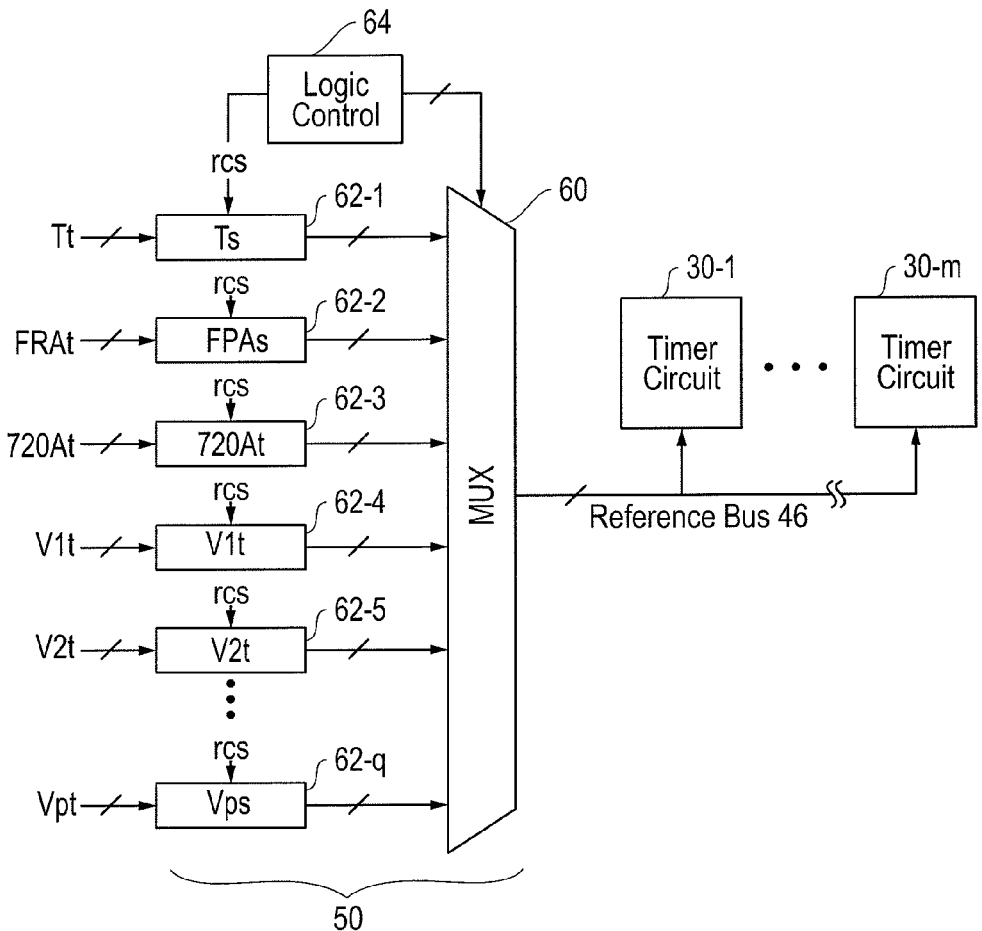
FIG. 3 illustrates in block diagram form, relevant components of an example reference-bus controller employed the control system shown in FIG. 1.

With continuing reference to FIGS. 1 and 2, FIG. 3 illustrates in block diagram form, relevant components of an example reference-bus controller 50. As shown, reference-bus controller 50 includes a multiplexer 60 coupled between reference-bus 46 and registers 62. Reference-bus controller 50 also includes a logic control circuit 64 that controls multiplexer 60 and registers 62.

Registers 62 capture multibit reference values pending at their respective inputs in response to assertion of a one-bit register control signal rcs by control circuit 64. Thus, registers 62-1-62-$q$ capture reference values Ts, FRAs, 720As, and V1s-Vps, respectively, which are pending at their inputs at the point in time s when control signal rcs is asserted. Any existing references value in registers 62 are overwritten with new reference values.

Figure 4:
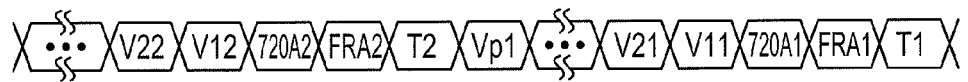
FIG. 4 represents an example transfer of reference values over the reference-bus of FIG. 1.

Multiplexer 60, as its name implies, multiplexes the contents of registers 62 onto reference-bus 46 for subsequent transmission to all timer circuits 30. The reference values of registers 62 are multiplexed onto reference-bus 46 and transmitted to timer circuits 30 in sequential order, beginning with the reference value stored in register 62-1 and ending with the reference value stored in register 62-$q$, in accordance with a multiplex control signals generated by logic control circuit 64. After the reference value of register 62-$q$ is transmitted, the process repeats: (1) logic control circuit asserts control signal rcs, (2) registers 62 capture the reference values that are pending at their respective inputs at the time when control signal rcs is asserted, and (3) multiplexer 60 multiplexes the reference values of registers 62 in order, beginning with the reference value of register 62-1 and ending with the reference value of register 62-$q$. FIG. 4 is a timing diagram that shows an example transmission of reference values by reference-bus controller 50 to timer circuits 30 over reference-bus 46. As seen, reference-bus 46 sequentially transmits a first set of reference values, beginning with T1 and ending with Vp1, each of which were stored in respective registers 62 at time t=1. After the first set is transmitted, reference-bus 46 sequentially transmits a second set of reference values, beginning with T2 and ending with Vp2, each of which were captured by respective registers 62 at later time t=2. This process continues until logic control circuit 64 receives a stop command.

As will be more fully described below, timer circuits 30 store the reference values Ts, FRAs, 720As, and V1s-Vps they receive. In an alternative embodiment, an additional register 62-$q$+1 (not shown) may be provided that stores a non-changing SYNC value, which is multiplexed onto reference-bus 46 after the reference value of register 62-$q$ is multiplexed onto reference-bus 46. In this alternative embodiment, control circuit 64 asserts register control signal res when the SYNC value is multiplexed onto the reference-bus. The SYNC value could be used by timer circuits 30 to insure that reference values they receive are stored in correct registers of the timer circuits. In still another embodiment, reference value identifiers (hereinafter RefIDs) may be transmitted concurrently with respective reference values to timer circuits 30 via bus 46 by a separate circuit under control of logic control 64, and the RefIDs could be used by the timer circuits 30 to insure that the reference values they receive are stored in the correct registers. The remaining detailed description will presume that timer circuits 30 are sufficiently synchronized with reference-bus controller 50 so that the SYNC value or the RefIDs are not needed by the timer circuits 30 to store reference values into the correct registers.

Event-Bus and Event-Bus Controller

Figure 5:
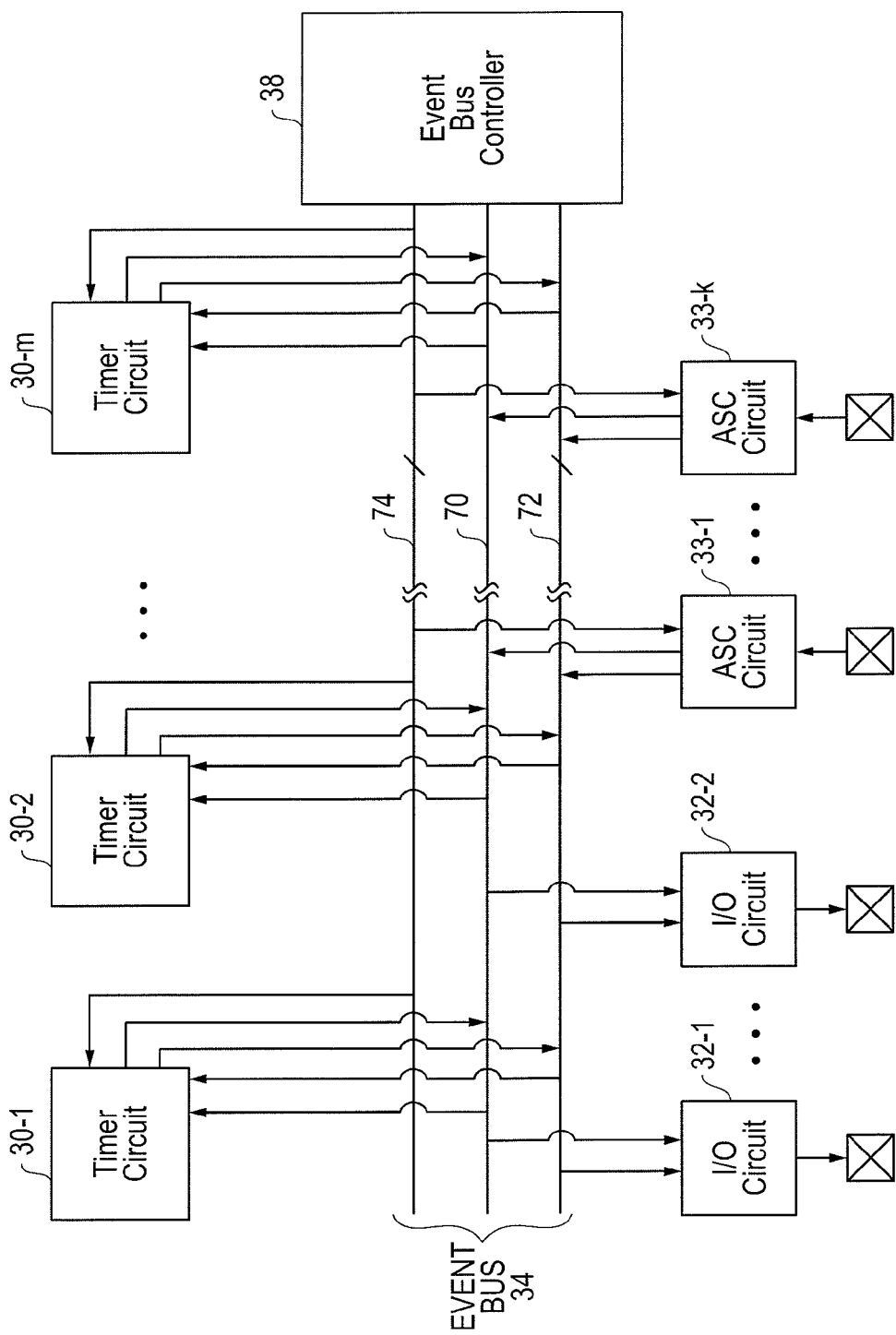
FIG. 5 illustrates in block diagram form, relevant components of an example event-bus employed in the control system shown in FIG. 1.

Control system 10 of FIG. 1 further includes event-bus controller 38 coupled to event-bus 34. With continuing reference to FIG. 1, FIG. 5 illustrates relevant components of an example event-bus 34, it being understood that the present invention should not be limited thereto. As seen, event-bus 34 includes three sub-buses: event-signal bus 70, event-ID bus 72, and event-command bus 74. In an alternative embodiment, event-bus 34 may lack event-command bus 74.

In the example embodiment, timer circuits 30 may concurrently transmit their event-IDs and corresponding event-signals to each other and to I/O circuits 32 via the event-signal bus 70 and event-ID bus 72, respectively. Likewise, ASC circuits 33 may concurrently transmit their event-IDs and corresponding event-signals to timer circuits 30 via the event-signal bus 70 and event-ID bus 72, respectively. Timer circuits 30 and ASC circuits 33, however, transmit their event-IDs and event-signals only when given permission by event-bus controller 38 in the example embodiment. As an aside, timer circuits 30 and/or ASC circuits 33 can be programmed to selectively ignore permission granted by event-bus controller 38.

Timer circuits 30 may be assigned respective timer circuit identifiers, and ASC circuits 33 may be assigned respective ASC circuit identifiers. In one embodiment, each timer circuit 30 transmits its event-signal and corresponding event-ID only when it receives permission in the form of a signal that contains the timer circuit identifier to which the timer circuit is assigned. Likewise each ASC circuit 33 transmits its event-signal and corresponding event-ID only when it receives permission that contains the ASC circuit identifier to which it is assigned. Event-command bus 74 or a separate bus (not shown) may transmit requests from timer circuits 30 and ASC circuits 33 for permission to event-bus controller 38. In the embodiment shown, all three buses 70-74 are coupled to event-bus controller 38. In an alternative embodiment, only event-command bus 74 is coupled to event controller 38. In the alternative that lacks an event-command bus, the event-ID bus 72 is coupled to controller 38.

In one embodiment, event-bus controller 38 sends permission in a round robin fashion to timer circuits 30 and ASC circuits 33. More particularly, event-bus controller 38 sends permission in sequential order to timer circuits 30, beginning with timer circuit 30-1 and ending with ASC circuit 33-$k$. After permission is sent to ASC circuit 33-$k$, event-bus controller 38 repeats the process of sending permission in sequential order, beginning again with timer circuit 30-1. This round robin process may be repeated until event-bus controller 38 receives a stop command. Event-bus controller may skip any timer circuit 30 and ASC circuit 33 that has not been programmed by CPU 40.

In one embodiment, each timer circuit 30 and ASC circuit 33 may concurrently transmit its event-signal and event-ID only when the event-signal is in the ON state. However, the present invention will be described with each timer circuit 30 concurrently transmitting its event-signal and event-ID for a short period of time (e.g., one cycle of the system clock mentioned above) in response to receiving permission from event-bus controller 38, regardless of whether the event-signal state is ON or OFF. Other embodiments are contemplated.

The present invention will be described with event-bus controller 38 operating in the round robin manner described above, but the present invention should not be limited thereto. In an alternative embodiment, event-bus controller 38 can send permission to a timer circuit 30 or ASC circuit 33 in response to event-bus controller 38 receiving a request for permission from that timer circuit 30 or ASC circuit 33 via event-command bus 74 or via a separate event-request bus (not shown). The request for permission should include the timer circuit identifier or ASC circuit identifier (mentioned above) of the timer circuit 30 or ASC circuit 33 that is requesting the permission. In this embodiment, the timer circuit or ASC circuit may send a request when its event-signal transitions (i.e., changes from ON to OFF or from OFF to ON). The conditions under which a timer circuit's or ASC circuit's event-signal transitions will be more fully described below.

When an event-request bus is employed, the event-request bus may be coupled to each timer circuit 30 and ASC circuit 33; however this alternative embodiment can be extended to include two or more event-request buses (not shown). Each of these separate event-request buses would be coupled to a respective group of timer circuits 30 and ASC circuits 33. For example a first event-request bus (not shown) may be coupled between event-bus controller 38, timer circuits 30-1-30-12, and ASC circuits 33-1-33-3, while a second event-request bus (not shown) may be coupled between event-bus controller 38, timer circuits 30-13-30-24, and ASC circuits 33-4-33-6, etc. With this arrangement, event-bus controller 38 may simultaneously receive separate requests for permission from respective timer circuits or ASC circuits via respective event-request buses. Assuming only one event-signal bus 70 and only one event-ID bus 72, event-bus controller 38 could prioritize the requests and send permissions in accordance thereto via event-command bus 74 in order to preclude collisions on the event-signal bus 70 and event-ID bus 72.

In the embodiment in which event-bus 34 lacks a command bus 74, timer circuits 30 and ASC circuit 33 may send their event-signals in response to receiving their assigned event-IDs from event-bus controller 38. As noted above, each timer circuit and ASC circuit is programmed with a unique event-ID, which may be known by event-bus controller 38. In this embodiment, event-bus controller may send event-IDs to timer circuits 30 and ASC circuits 33 via event-ID bus 72 in a round robin fashion or in response to receiving specific requests (that may contain event-IDs) from time circuits 30 and ASC circuits 33 via one or more of the request-buses mentioned above. When a timer circuit 30 or ASC circuit 33 receives an event-ID from controller 38 that matches the event-ID assigned to it, the timer circuit 30 will respond by outputting its event-signal onto bus 70. Timer circuit 30 or ASC circuit 33 could send its event-signal while controller 38 is asserting the matching event-ID on the event-ID bus 72, or the timer circuit or ASC circuit could send its event-signal immediately after controller 38 sends the matching event-ID but before controller 38 sends the next event-ID on bus 72.

I/O Circuits

Figure 6:
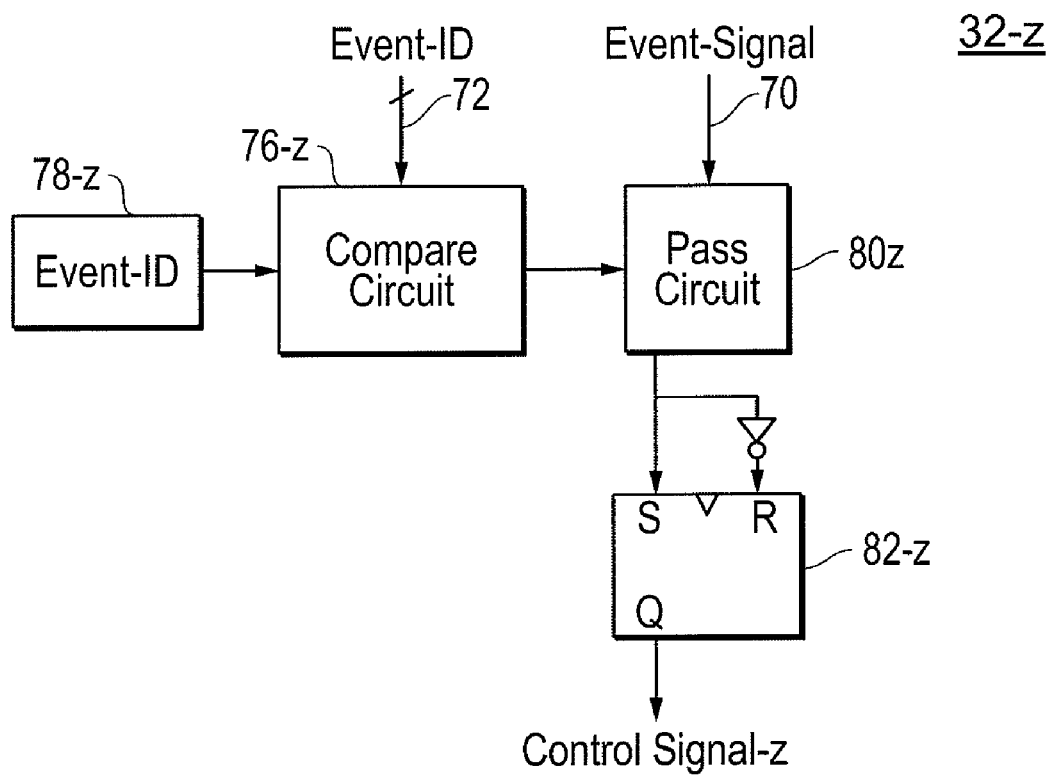
FIG. 6 illustrates in block diagram form, relevant components of an example I/O circuit employed in the control system shown in FIG. 1.

With continuing reference to FIG. 1, I/O circuits 32 when programmed, generate control signals as a function of event-signals. With continuing reference to FIGS. 1 and 5, FIG. 6 illustrates in block diagram form, relevant components of an example I/O circuit 32-z. For purposes of explanation only, all I/O circuits 32 are assumed to include the components shown in FIG. 6.

I/O circuit 32-z includes a compare circuit 76-z coupled to receive event-IDs from event-ID bus 72. Compare circuit 76-z is also coupled between programmable register 78-z and pass circuit 80-z. The output of a pass circuit 80-z is provided to an S input of flip-flop 82-z and to an input of inverter 84-z. The output of inverter 84-z is coupled to an R input of SR flip-flop 82-z. Importantly, the control signals, such as the spark signal mentioned above, are the Q output signals, respectively, of flip-flops 82.

Programmable register 78-z is coupled to communication path 42 (not shown in FIG. 6) and configured to receive and store an event-ID selected by CPU 40. Compare circuit 76-z continuously compares the event-ID of register 78-z with event-IDs received from event-ID bus 72. In general, compare circuit 76-z generates a one-bit pass circuit signal in response to comparing the event-IDs. The pass circuit signal is ON when the event-ID of register 76-z equals the event-ID on bus 72. Otherwise, the pass circuit signal is OFF. In an alternative embodiment, each I/O circuit 32-z may include two or more programmable registers 78-z coupled to compare circuit 76-z. Each of the separate event-ID registers 76-z may store distinct event-IDs, and the pass circuit signal generated by compare circuit 76-z is ON if the event-ID received on bus 72 equals any of the event-IDs stored in event-ID of registers 76-z.

In one embodiment, pass circuit 80-z may take form in a simple transistor that couples event-signal bus 70 to the S input of flip-flop 82-z and to the input of inverter 84-z when the pass circuit signal is ON. When coupled, both the S input and inverter 84-z receive the event-signal pending on event-signal bus 70. Initially, the Q output (i.e., control signal) of flip-flop 82-z is set to OFF, but will toggle to ON when the S input of flip-flop 82-z receives an event-signal that is ON. While the control signal output of flip-flop 82-z is ON, it will toggle to OFF when inverter 84-z receives an event-signal that is OFF. A capacitor (not shown) could be added to hold the state of the event-signal at the S input and the inventor 84-z input until these inputs are coupled again to event-signal 70 via pass circuit 80.

As noted in the above example embodiment, event-signal bus 70 and event-ID bus 72 operate in a round robin fashion; timer circuits 30 and ASC circuits 33 transmit their event-signal/event-ID pairs, regardless of event-signal state, in sequential fashion beginning with timer circuit 30-1 and ending with ASC circuit 33-k. One or more of the timer circuits 30 and ASC circuits 33 may be programmed, as will be more fully described below, to transmit an event-ID that equals the event-ID programmed into, for example, register 78-1 of I/O circuit 32-1. To illustrate, presume timer circuit 30-1 is configured to concurrently transmit event-ID=SPARK and event-signal ES-1, which is ON or OFF, when given permission by event-bus controller 38. Further, presume register 78-1 of I/O circuit 32-1 stores SPARK as an event-ID. In this situation, when timer circuit 30-1 concurrently transmits event-signal ES-1 and SPARK to pass circuit 80-1 and compare circuit 76-1, respectively, pass circuit 80-1 will pass the event-signal ES-1 to flip-flop 82-1 and inverter 84-1 since compare circuit 76-1 detects a match between the SPARK event-ID on event-ID bus 72 and the SPARK event-ID in register 78-1.

Timer circuits 30 and ASC circuits 33 will transmit their respective event-signals for one system clock cycle at regularly scheduled times in accordance with the example round robin process by which event-bus controller 38 grants permission. As such, the minimum time period during which flip-flop 82-z asserts the control signal (i.e., the Q output) in the ON state, may be defined by (m+k)/(system clock frequency) where m+k is the total number of timer circuits 30 and ASC circuits 33. As an aside, (m+k)/(system clock frequency) presumes all timer circuits 30 and ASC circuits 33 transmit their event-signals when given permission. The minimum time period can be reduced if the system clock frequency is increased, or if round-robin permission is given to only a subset of the timer circuits 30 and ASC circuits 33. Presuming the frequency of the system clock is high enough, the minimum time period (m+k)/(system clock frequency) of control signal assertion should have marginal effect to the overall proper operation of the control system 10 and the engine controlled thereby.

The I/O circuit 32-z is described as a device that generates a control signal based on event-signals it receives from one or more of the timer circuits 30 and ASC circuits 33. However, as its name implies, the I/O circuit in another embodiment could also be used to receive an event-signal for subsequent transmission to, for example, one or more timer circuits 30 or other devices. The I/O circuit in this other embodiment may need permission from event-bus controller 38 before it can transmit the event-signal it receives in much the same manner that timer circuits 30 and ASC circuits 33 need permission from event-bus controller 38 before they send event-signal/event-ID pairs. However, the present invention will be described with I/O circuits 32 functioning as devices that only generate control signals as described above.

Timer Circuits

Figure 7:
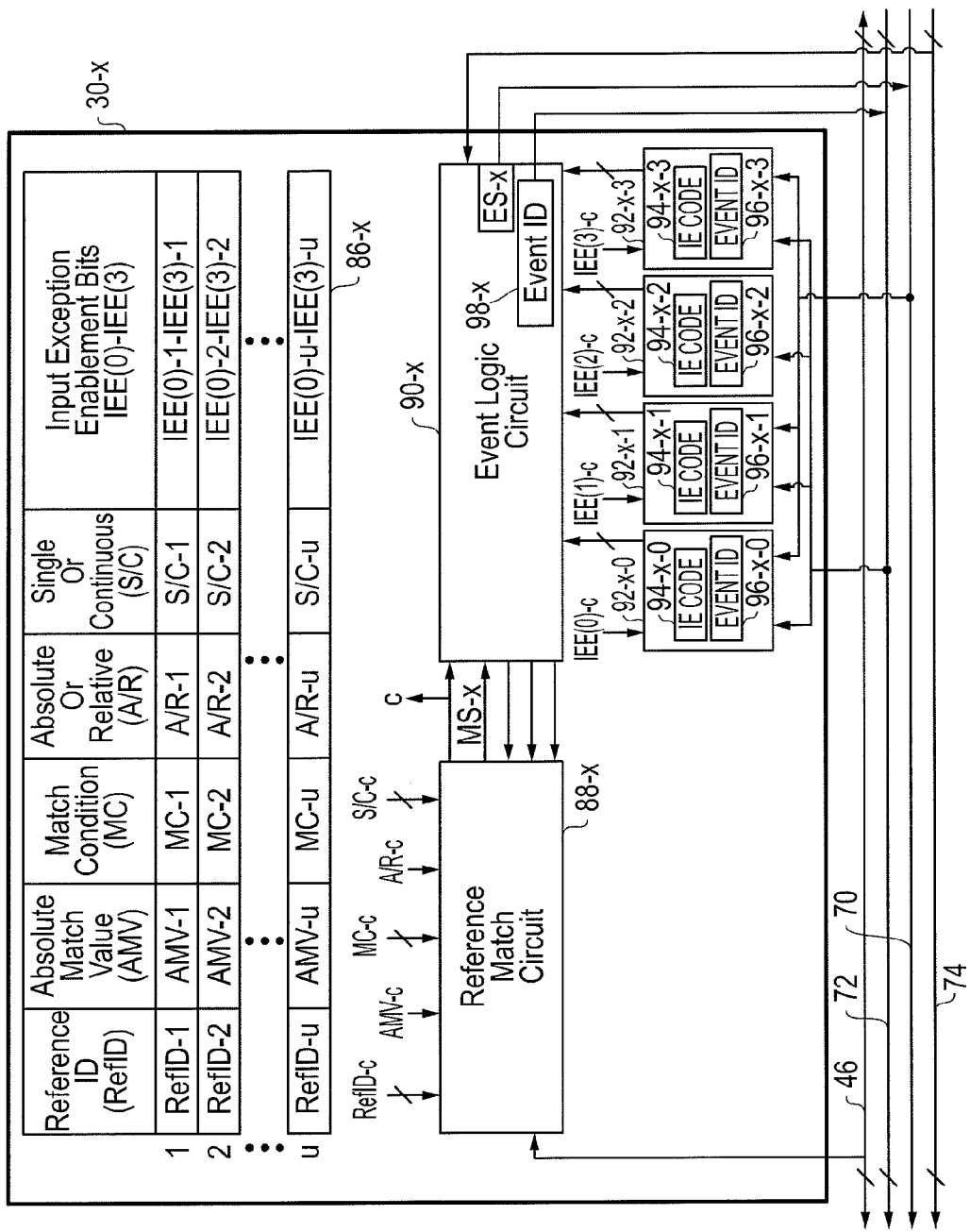
FIG. 7 illustrates relevant components of an example timer circuit employed in the control system shown in FIG. 1.

Returning to FIG. 1, timer circuits 30 when programmed, generate one-bit event-signals, which may be subsequently transmitted to each other and to I/O circuits 32 via event-bus 34. With continuing reference to FIGS. 1 and 5, FIG. 7 illustrates relevant components of an example timer circuit 30-x, which includes a programmable memory device 86-x, a reference match circuit 88-x, an event logic circuit 90-x, and input exception (IE) circuits 92-x-0-92-x-3. For purposes of explanation only, it will be presumed that each of the timer circuits 30 shown in FIG. 1 are identical in structure to timer circuit 30-x shown in FIG. 7. In an alternative embodiment, one or more of the timer circuits 30 shown in FIG. 1 may have differences when compared to that shown in FIG. 7.

Programmable memory device 86-x, event logic circuit 90-x, and IE circuits 92-x-0-92-x-3 are in data communication with CPU 40 via communication path 42 (not shown in FIG. 7). Programmable memory device 86-x receives and stores lines of operational parameters from CPU 40. Each line of operational parameters may include a multibit reference identification (RefID), a multibit absolute match value (AMV), a multibit match condition (MC), a one-bit absolute or relative value (A/R), a one-bit single or continuous value (S/C), and four one-bit input exception enablement (IEE(0)-IEE(3)) bits as shown.

Reference match circuit 88-x, event logic circuit 90-x, and/or IE circuits 92-x-0-92-x-3 operate in accordance with the operational parameters of programmable memory device 86-x or other operational parameters provided by CPU 40. The present invention should not be limited to the operational parameters shown in the Figures or described herein. Additional operational parameters may be employed to configure operation of reference match circuit 88-x, event logic circuit 90-x, and/or IE circuits 92-x-0-92-x-3. For example, each line in programmable memory device 86-x may include a first operational parameter FOP (not shown). Reference match circuit 88-x may operate in one way when FOP is set to one value and when reference match circuit 88-x receives a first command signal (more fully described below) from event logic circuit 90-x, and reference match circuit 88-x may operate in a different way when FOP is set to another value and when reference match circuit 88-x receives the first command signal from event logic circuit 90-x, all other conditions being equal. Further, each line may include a second operational parameter SOP (not shown), which is provided to event logic circuit 90-x. SOP, depending on its value, may configure event logic circuit 90-x to selectively ignore permission granted by event-bus controller 38 to transmit timer circuit 30-x's event-signal ES-x and event-ID. For example, event logic circuit 90-x can be configured to transmit its event-signal ES-x and/or event-ID onto event bus 34 only once when ES-x first toggles from ON to OFF or from OFF to ON, even though event logic circuit 90-x is given subsequent permission to transmit its event-signal ES-x. Still further, event logic circuit 90-x may store a maximum event count value (MECV) that is received from CPU 40. As will be more fully described below, the event logic circuit 90x can compare MECV with a number of increment count IE commands that event logic circuit 90-x receives from one or more of IE circuits 92-x-0-92-x-3. When the number increment count IE commands received from one or more of the IE circuits 92-x-0-92-x-3 equals MECV, event logic circuit 90-x will toggle its event-signal ES-x from OFF to ON or from ON to OFF, and event logic circuit 90-x will maintain the toggled state of event-signal ES-x event at least until event-logic circuit receives a start or restart IE command (more fully described below) from one of the IE circuits 92-x-0-92-x-3.

Programmable memory device 86-x shows four input exception enablement bits IEE(0)-IEE(3) corresponding to four IE circuits 92-x-0-92-x-3, respectively, it being understood that in alternative embodiments the programmable memory device may include more than four or less than four input exception enablement bits corresponding to respective IE circuits.

Each line of parameters in programmable memory device 86-x is addressed by a respective line number. As will be more fully described below, reference match circuit 88-x generates a line number value c, which is used by programmable memory device 86-x and event logic circuit 90-x. Reference match circuit 88-x changes the value of c during active operation. In response to receiving c, programmable memory device 86-x sends operational parameters of line c to reference match circuit 88-x and IE circuits 92-x. Thus, at any point in time reference match circuit 88-x receives RefID-c, AMV-c, MC-c, A/R-c, and S/C-c, and IE circuits 92-x-0-92-x-3 receive IEE(0)-c-IEE(3)-c, respectively. The value of c may be affected by command signals that are received from event logic circuit 90-x as will be more fully described below. Although not shown, programmable memory device 86-x may send one or more operational parameters of line c to event logic circuit 90-x, and event logic circuit 90-x may operate in accordance with the one or more operational parameters it receives.

Reference match circuit 88-x generates a match-signal MS-x, the state of which may depend on one or more of the reference values (e.g., Ts, FRAs, etc.) that are received from reference-bus controller 50 (see FIGS. 3 and 4) via reference-bus 46. Event logic circuit 90-x, in turn, may generate its event-signal ES-x as a function of match-signal MS-x. For the purposes of explanation only, event-signal EX-x is presumed equal to match-signal MS-x, unless otherwise noted.

The state of event-signal ES-x may depend on an IE command from one of IE circuits 92-x, as will be more fully described below. IE commands may also prompt event logic circuit 90-x to assert command signals (e.g., start signal, reset signal, force signal, stop signal, etc, as will be more fully described below), which may affect the state of match-signal MS-x, which in turn may affect the state of event-signal ES-x.

Event logic circuit 90-*x* includes a programmable register 98-*x* that is in data communication with CPU 40 via communication path 42 (not shown in FIG. 7). Programmable register 98-*x* stores an event-ID selected by CPU 40. Event logic circuit 90-*x* is coupled to receive permission from event-bus controller 38 via event-command bus 74 to transmit its event-signal and event-ID, and when given permission by event-bus controller 38 (not shown in FIG. 7) event logic circuit 90-*x*, in the embodiment shown, concurrently transmits its event-signal ES-x, regardless of state, and event-ID of register 98-*x* onto event-signal bus 70 and event-ID bus 72, respectively, for one cycle of the system clock. The present invention is described with reference to registers that temporarily store event-IDs selected by CPU 40. In other words, the event-IDs in these registers may be overwritten with new event-IDs. In an alternative embodiment, one or more of these registers may be configured to permanently store event-IDs.

Each of the IE circuits 92-*x* contains a pair of programmable registers 94-*x*-*y* and 96-*x*-*y* that are in data communication with CPU 40 via the communication path 42. Each programmable register 94-*x*-*y* is configured to store one of many different IE codes selected by CPU 40. Each programmable register 96-*x*-*y* is configured to store an event-ID selected by CPU 40. IE circuits 92-*x* receive event-signals and event-IDs via event-signal bus 70 and event-ID bus 72, respectively. Additionally, IE circuits 92-*x* receive respective input exception enablement IEE bits from line c of programmable memory device 86-*x*. As noted, IE circuits 92-*x* send IE commands to event logic circuit 90-*x*. When an IE circuit 92-*x*-*y* receives an event-ID that matches the event-ID stored within its programmable register 96-*x*-*y* and when its input exception enablement bit IEE(y)-c is ON, the IE circuit sends an IE command that corresponds to the IE code that is stored within programmable register 94-*x*-*y*.

Reference Match Circuit

Figure 8:
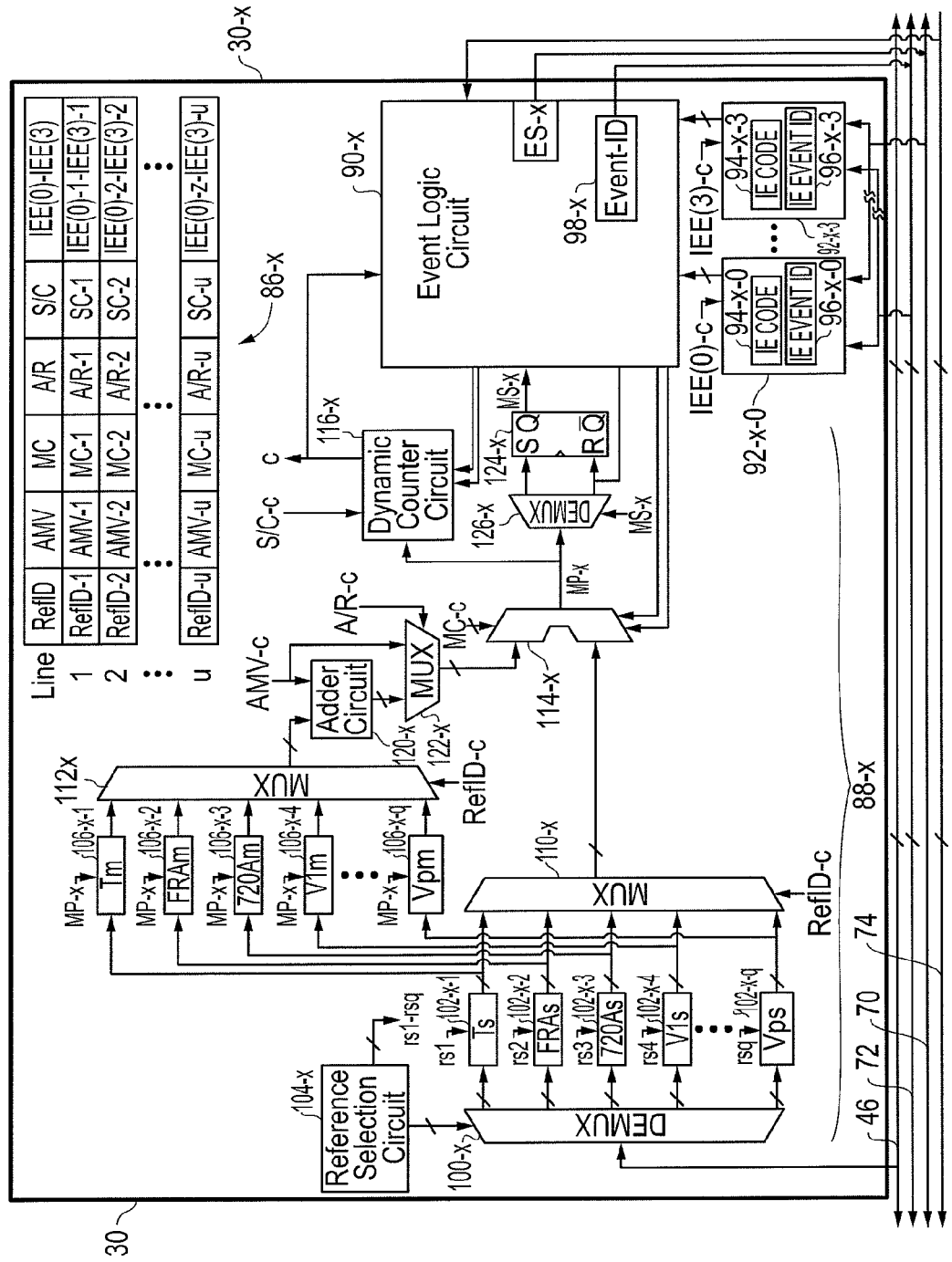
FIG. 8 illustrates the timer circuit of FIG. 7 with a more detailed view of a reference match circuit thereof.

Event logic circuit 90-*x* may generate its event-signal ES-x as a function of the match-signal MS-x generated by reference match circuit 88-*x*, and the state of match-signal MS-x may depend on one or more reference values (e.g., FRAs, V1s, etc.). With continuing reference to FIG. 1, FIG. 8 illustrates the timer circuit 30-*x* of FIG. 7 with a more detailed view of reference match circuit 88-*x*. As shown, reference match circuit 88-*x* includes a demultiplexer 100-*x*, which demultiplexes reference values (see FIGS. 3 and 4) it receives from reference-bus 46 for subsequent capture by registers 102-*x*. A reference selection circuit 104-*x* controls demultiplexer 100-*x* and registers 102-*x* to insure that the reference values are captured by the correct registers 102-*x*. To this end, reference selection circuit 104-*x* asserts a multibit demultiplexer control signal, which is used by demultiplexer 100-*x* to demultiplex reference values Ts, FRAs, 720As, and V1s-V1ps to the inputs of registers 102-*x*-1-102-*x*-*q*, respectively, as the reference values are sequentially received from reference-bus 46. Selection circuit 104-*x* also sequentially asserts one-bit control signals rs1-rsq for controlling registers 102-*x*-1-102-*x*-*q*, respectively. Registers 102-*x*-1-102-*x*-*q* capture the reference values pending at their respective inputs in response to assertion of rs1-rsq, respectively. Reference selection circuit 104-*x* is synchronized with reference-bus 46 so that reference values Ts, FRAs, 720As, and V1s-V1ps are captured by registers 102-*x*-1-102-*x*-*q*, respectively, as the reference values are received from reference-bus 46. The process of capturing and storing reference values Ts, FRAs, 720As, and V1s-V1ps into registers 102-*x*-1-102-*x*-*q*, respectively, is repeated with each new set of reference values that are received via reference-bus 46. Thus, the contents of registers 102-*x* are regularly updated with new reference values.

The outputs of registers 102-*x* are coupled to inputs of save registers 106-*x*, respectively, and save registers 106-*x* capture the reference values of registers 102-*x*, respectively, in response to save registers 106-*x* receiving a match pulse MP-x from arithmetic logic unit (ALU) 114-*x* as will be more fully described below. The contents of save registers 106-*x* may be used to generate a relative match value RMV, which ALU circuit 114-*x* may compare with a regularly changing reference value of one of the registers 102-*x* as will be more fully described below. The outputs of registers 102-*x* are coupled to respective inputs of multiplexer 110-*x*, and the outputs of save registers 106-*x* are coupled to respective inputs of multiplexer 112-*x* as shown. The operational aspects of these multiplexers will be more fully described below.

Reference match circuit 88-*x* and IE circuits 92-*x* operate according to operational parameters contained in a selected line of programmable memory device 86. Programmable memory device 86-*x* receives line selector value c from reference match circuit 88-*x*. In response, programmable memory device 86-*x* sends operational parameters in line c (e.g., RefID-c, AMV-c, MC-c, etc.) to reference match circuit 88-*x* and IE circuits 92-*x*. In essence, reference match circuit 88-*x* selects the operational parameters it uses and used by IE circuits 92-*x*-0-92-*x*-3.

Reference match circuit 88-*x* includes a dynamic counter circuit 116-*x*, which generates the aforementioned line selector value c. In one embodiment, dynamic counter circuit 116-*x* increments or decrements c in response to receiving a match pulse MP-x from ALU circuit 114-*x*. Dynamic counter circuit 116-*x* also receives the S/C-c bit from programmable memory device 86-*x*. Dynamic counter circuit 116-*x* increments c by 1 when S/C-c set to S for single, and dynamic counter circuit 116-*x* decrements c by 1 when S/C-c is set to C for continuous.

Dynamic counter circuit 116-*x* resets c to 1 in response to receiving a start or stop signal from event logic circuit 90-*x*. With c set to 1, reference match circuit 88-*x* and IE circuits 92-*x*-0-92-*x*-3 receive operational parameters (e.g., RefID-1, AMV-1, MC-1, etc.) from line 1 of programmable memory device 86-*x*. When dynamic counter circuit 116-*x* increments c from 1 to 2, reference match circuit 88-*x* and IE circuits 92-*x*-0-92-*x*-3 receive operational parameters (e.g., RefID-2, AMV-2, MC-2, etc.) from line 2 of programmable memory device 86-*x*. If dynamic counter circuit 116-*x* decrements c from 2 back to 1 as it may if S/C-2 is set to C for continuous, reference match circuit 88-*x* and IE circuits 92-*x*-0-92-*x*-3 will again receive operational parameters from line 1 of programmable memory device 86-*x*.

As noted above, dynamic counter circuit 116-*x* increments or decrements c in response to receiving a match pulse MP-x from ALU circuit 114-*x*, which operates in the active or inactive mode. In the active mode ALU circuit 114-*x* can assert match pulses MP-x, and in the inactive mode ALU circuit 114-*x* doesn't assert match pulses MP-x. ALU circuit 114-*x* operates in the active mode until it receives a stop signal from event logic circuit 90-*x*, and ALU circuit 114-*x* will remain in the inactive state until it receives a start signal from event logic circuit 90-*x*.

ALU circuit 114-*x* asserts a match pulse MP-x in response to receiving a force signal (more fully described below) from event logic circuit 90-*x*. ALU circuit 114-*x* may also assert a match pulse MP-x in response to comparing a reference value selected by multiplexer 110-*x* with either the absolute match value AMV-c from programmable memory device 86-*x* or a relative match value RMV that is calculated by adder circuit 120-x. For example, ALU circuit 114-x may assert a match pulse MP-x when reference value V1s is found to compare equally with absolute match value AMV-1.

Outputs of multiplexers 110-x and 112-x are coupled to inputs of ALU circuit 114-x and adder circuit 120-x, respectively, as shown. Multiplexers 110-x and 112-x select respective reference values stored in registers 102-x and 106-x, respectively, according to the reference identification RefID-c from line c of programmable memory device 86-x. To illustrate, when RefID-c is set to one of T, FRA, 720A, and V1-Vp, multiplexer 110-x selects a respective one of reference values Ts, FRAs, 720As, and V1s-Vps of registers 102-x, and in similar fashion multiplexer 112-x selects a respective one of reference value Tm, FRAm, 720Am, and V1m-Vqm of save registers 106-x. The reference value selected by multiplexer 112-x is sent to adder circuit 120-x, which also receives absolute match value AMV-c from programmable memory device 86-x. Adder circuit 120-x, in turn, adds these two values to generate relative match value RMV. Multiplexer 122-x selects either the RMV from adder circuit 120-x or AMV-c from programmable memory device 86-x for input to ALU circuit 114-x depending on the state of the absolute/relative bit A/R-c; if A/R-c is set to A for absolute, multiplexer 122-x selects AMV-c for input to ALU circuit 114-x, and if A/R-c is set to R for relative, multiplexer 122-x selects RMV for input to ALU circuit 114-x.

In addition to receiving the reference value and either RMV or AMV-c, ALU circuit 114-x receives a match condition MC-c from programmable memory device 86-x. ALU circuit 114-x compares the reference value input selected by multiplexer 110-x with either RMV or AMV-c to determine if the match condition MC-c is meet. For example, ALU circuit 114-x may compare the input values to determine if they are equal to each other. If the inputs to ALU circuit 114-x satisfy the match condition MC-c, ALU circuit 114-x asserts a short lived match pulse MP-x. For example, with MC-c set to "equal," ALU circuit 114-x asserts the match pulse MP-x when the reference value selected by multiplexer 110-x equals either RMV or AMV-c, the value selected by multiplexer 122-x according to A/R-c.

MC-c may be encoded to define many different conditions such as: equal to, less than, greater than, less than or equal to, and greater than or equal to. In addition, MC-c may be set to "immediate." As noted above ALU circuit 114-x may assert the match pulse MP-x in response to receiving a force match-signal from event logic circuit 90-x. With MC-c set to immediate, ALU circuit 114-x asserts a match pulse MP-x only when ALU circuit-x receives the force signal from event logic circuit 90-x.

As noted, the match pulse MP-x triggers save registers 106-x and dynamic counter circuit 116-x; save registers 106-x capture the reference values in registers 102-x, respectively, in response to ALU circuit 114-x asserting the match pulse MP-x, and dynamic counter circuit 116-x increments or decrements c in response to ALU circuit 114-x asserting the match pulse MP-x. Save registers 106-x should capture the reference values in registers 102-x, respectively, before dynamic counter circuit 116-x increments or decrements c. ALU circuit 114-x may be synchronized with reference selection circuit 104-x so that when ALU circuit 114-x asserts its match pulse MP-x, it is asserted immediately after the contents of register 102-x-q are updated with a new reference value from reference-bus 46 and before the contents of register 102-x-1 are updated with a new reference value from reference-bus 46.

Save registers 106-x and dynamic counter circuit 116-x are not the only components of timer circuit 30-x that receive the match pulse MP-x. In addition, SR flip-flop 124-x receives match pulse MP-x from ALU circuit 114-x via demultiplexer 126-x, and SR flip flop 124-x toggles its one-bit output Q in response thereto. Importantly, The Q output of flip-flop 124-x is the match-signal MS-x that is provided to and used by event logic circuit 90-x for generating its event-signal ES-x. The match-signal MS-x also controls demultiplexer 126-x.

Timer circuit 30-x can be indirectly started or restarted by, for example, another timer circuit 30 or event-bus controller 38 as will be more fully described below. When started or restarted, event logic circuit 90-x sends a start signal to ALU circuit 114-x and dynamic counter circuit 116-x, which in turn activates ALU circuit 114-x and sets c to 1, if c is not already set to 1. In addition, event logic circuit 90-x sends a reset signal to the R input of flip-flop 124-x, which sets the match-signal MS-x to OFF. When match condition MC-c is meet as described above, or when event logic circuit 90-x asserts the force signal, ALU circuit 114-x asserts and sends a match pulse MP-x to the S or R input of flip-flop 124-x depending on the state of the match-signal MS-x at the time; when the match-signal MS-x is ON, the output of ALU circuit 114-x is connected to the S input of flip-flop 124, and when the match-signal MS-x is OFF, the output of ALU circuit 114-x is connected to the R input of flip-flop 124-x. Match signal MS-x will toggle from OFF to ON in response to ALU circuit 114-x asserting the match pulse MP-x, and match-signal MS-x will remain in the ON state until ALU circuit 114-x subsequently reasserts match pulse MP-x.

The foregoing describes several command signals issued by event logic circuit 90-x, but additional command signals are contemplated. For example, event logic circuit 90-x could issue a capture signal that triggers save registers 106-x to capture the reference values in registers 102-x without ALU circuit 114-x generating a match pulse MP-x. Event logic circuit 90-x may issue several command signals in response to receiving a IE command from one of the IE circuits 92-x. For example, event logic circuit could issue the capture signal along with a stop signal that is transmitted to either ALU circuit 114-x or dynamic counter circuit 116-x or both.

Figure 9:
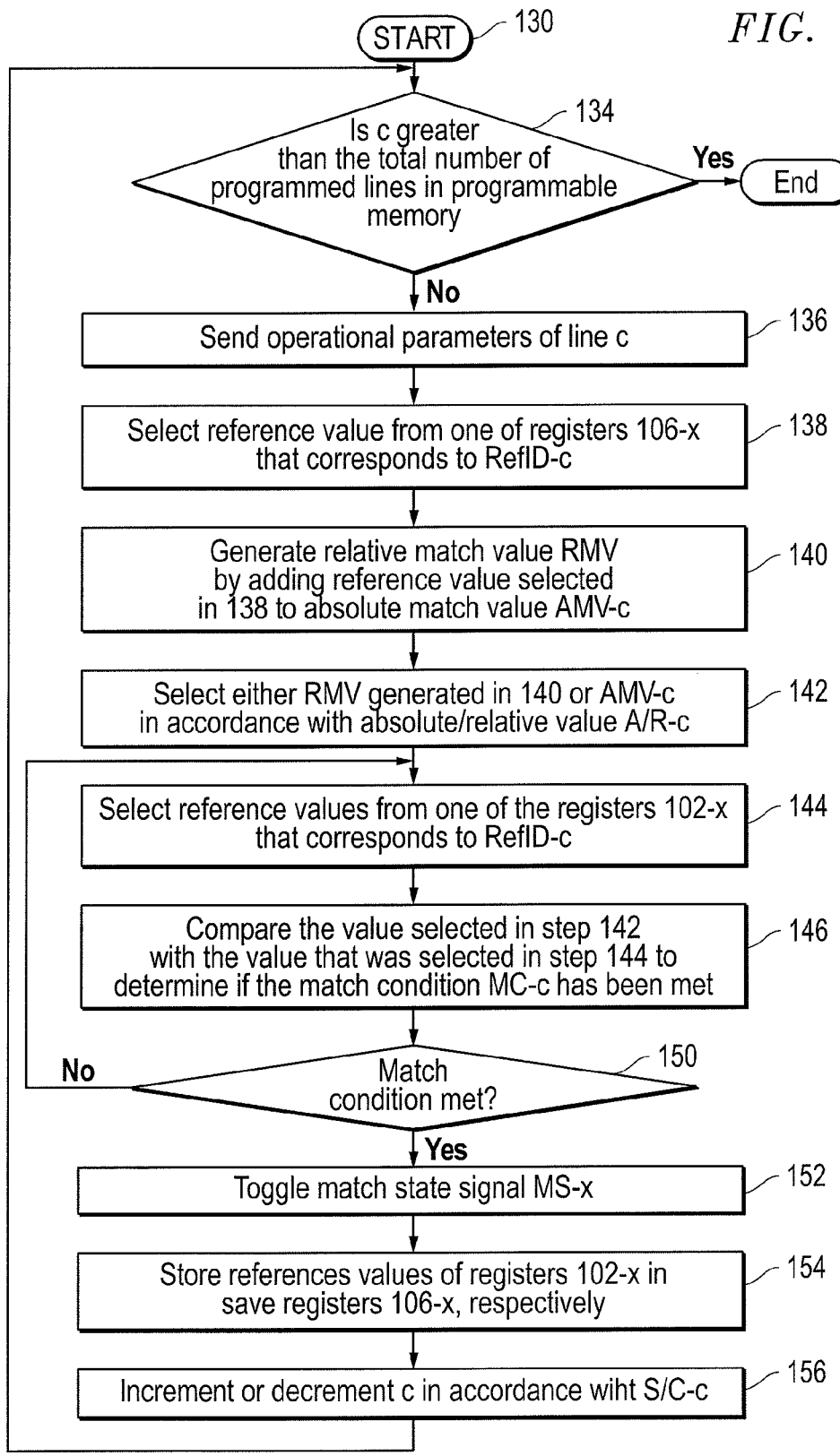
FIG. 9 illustrates relevant operational aspects of an example process performed by the reference match circuit of FIG. 8.

FIG. 9 illustrates relevant operational aspects of an example process performed by reference match circuit 88-x in accordance with one embodiment. The process initiates when event logic circuit 90-x asserts the start signal mentioned above, which in turn activates ALU circuit 116-x and resets c to 1. Event logic circuit 90-x also asserts the reset signal, which in turn resets the match-signal MS-x to OFF. It is noted that c should be set to 1 and match-signal MS-x should be set to OFF before event logic circuit 90-x asserts the start and reset signals. For purposes of explanation only, registers 102-x begin capturing respective reference values as described above when event logic circuit 90-x asserts the start signal.

Event logic circuit 90-x can receive and store a value from programmable memory device 86-x or elsewhere, which represents the total number of programmed lines therein. In step 134, event logic circuit 90-x compares the current value of c with the total number of programmed lines in programmable memory device 86-x. If c is greater than the total number of programmed lines, the process ends by event logic circuit 90-x generating the stop signal, which in turn deactivates ALU circuit 116-x and resets c to 1. Event logic circuit 90-x also asserts the reset signal, which in turn resets the match-signal MS-x to OFF.

Presuming c is less than or equal to the total number of lines in programmable memory device 86-x, programmable memory device 86-*x* sends operational parameters of line c to reference match circuit 88-*x* and IE circuits 92-*x*. For example, the selector input of multiplexers 110 and 112 receive reference identifier RefID-c, ALU circuit 114 receives MC-c, dynamic counter circuit 116 receives S/C-c, adder circuit 120 receives AMV-c, and multiplexer 122 receives AMV-c and A/R-c. Before the process of FIG. 9 is started, c is initially set to 1, so step 136 may be skipped initially. For purposes of explanation only, S/C-1 of programmable memory device 86 is always set to S for single and A/R-1 is always set to A for absolute in each programmed timer circuit 30.

At step 138, multiplexer 112-*x* selects a reference value stored in one of the save registers 106 that corresponds to RefID-c. The reference value selected in step 138 is added to AMV-c by adder circuit 120-*x* in step 140 to generate RMV, which is subsequently provided to multiplexer 122-*x*. In step 142, multiplexer 122-*x* selects one of the two input values thereto (i.e., the absolute match value AMV-c or the relative match value RMV generated by adder circuit 120-*x*) in accordance with the absolute/relative bit A/R-c. As an aside, when c is set to 1, step 138 and step 140 are irrelevant since A/R-1 is presumed set to A, and as a result ALU circuit 114-*x* initially compares the reference value selected by multiplexer 110-*x* with absolute match value AMV-1 to determine whether match condition MC-1 is met.

The value selected in step 142 is provided as one input of ALU circuit 114-*x*. Multiplexer 110-*x* selects the other input to ALU circuit 114-*x*. Specifically, in step 144, multiplexer 110-*x* selects one of the reference values of registers 102-*x* that corresponds to RefID-c. In step 146, ALU circuit 114-*x* compares the two inputs in order to determine whether the match condition MC-c is met.

The match condition MC-c can be any one of many different match conditions, including: equal to, equal to or less than, immediate, etc. To illustrate, with match condition MC-c set to "equal to or greater than," the match condition MC-c will be met if the reference value selected by multiplexer 110-*x* is equal to or greater than the value selected by multiplexer 122-*x*. If the match condition MC-c is not met, the process returns to step 144. Because the contents of registers 106-*x* are regularly updated, a new reference value may be selected in step 144 for subsequent comparison in step 146.

When the match condition MC-c is met in step 150, ALU circuit 114-*x* will assert a match pulse MP-x, which is subsequently demultiplexed to either the S input or the R input of flip-flop 124-*x*, which in turn toggles the match state MS-x signal as shown in step 152. Also, the reference values held in save registers 106-*x* are overwritten with the reference values held in registers 102-*x*, respectively, as shown in step 154. Thereafter, dynamic counter 116-*x* either increments or decrements the c, depending on the value of S/C-c, and the process returns to step 134 and continues therefrom if c does not exceed the total number of lines of operational parameters. As an aside, if S/C-c is set to C for continuous, reference match circuit 88-*x* will enter a loop state during which it will alternate between operation in accordance with the operational parameters of line c and operation in accordance with the operational parameters of line c-1.

Figure 10A:
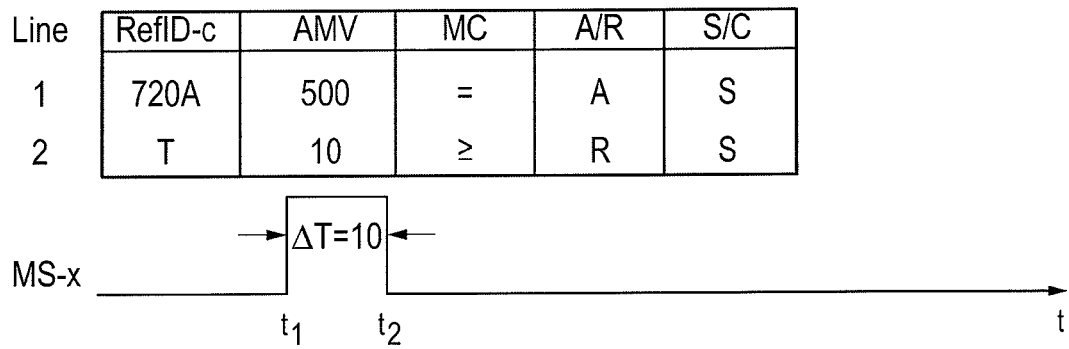
FIGS. 10A and 10B show example timing diagrams of a match-signal generated by the reference match circuit of FIG. 8 as it operates according to the process shown in FIG. 9.
Figure 10B:
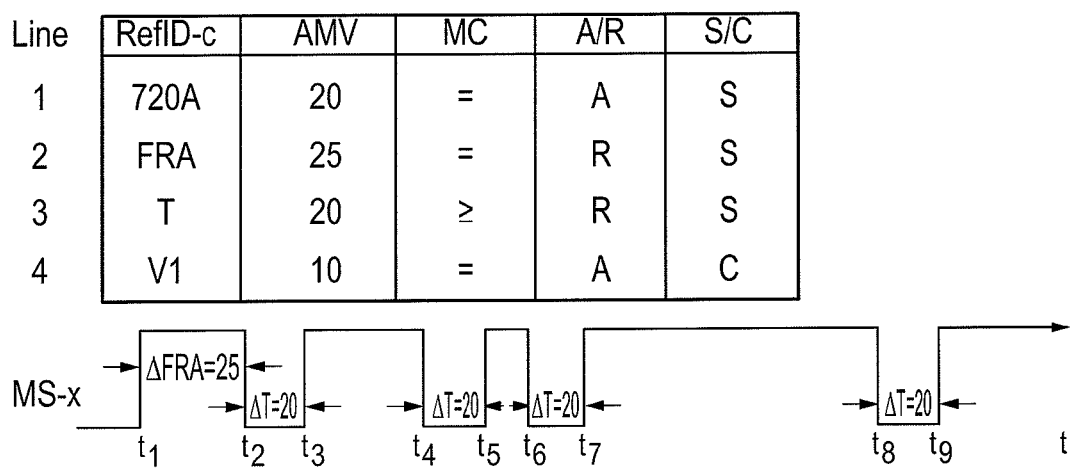

With continuing reference to FIG. 8, FIGS. 10A and 10B show example timing diagrams of the match-signal MS-x that are generated by reference match circuit 88-*x* in accordance with the process shown in FIG. 9. In FIG. 10A, programmable memory device 86-*x* includes 2 lines of example operational parameters. With c previously set to 1, the operational parameters of line 1 are provided to various components of timer circuit 30-*x*, including reference match circuit 88-*x* and IE circuits 92-*x*. Because match-signal MS-x is initially reset to OFF, the first match pulse MP-x generated by ALU circuit 114-*x* will be transmitted to the S input of flip-flop 124-*x* via demultiplexer 126-*x*. The A/R-1 bit in line 1 of programmable memory device 86-*x* in FIG. 10A is set to A or absolute, which means that multiplexer 122-*x* selects absolute match value AMV-1=500 as one input for ALU circuit 114-*x*. Line 1 indicates that RefID-1=720A (the 720 angle reference value), which means multiplexer 110-*x* selects reference value 720As of register 102-*x*-3 as the other input to ALU circuit 114-*x* in accordance with step 144. Because MC-1 is set to "equal," ALU circuit 114-*x* will assert a match pulse MP-x when the inputs to ALU circuit 114-*x* are equal. Presuming ALU circuit 114-*x* receives 720As=500 at time t1, ALU circuit 114-*x* will assert match pulse MP-x, which toggles match-signal MS-x to ON in accordance with step 152. Shortly after time t1, the save registers 106-*x* capture the reference values of registers 102-*x*, respectively, in accordance with step 154. Dynamic counter 110-*x* increments c from 1 to 2 since S/C-1=S in accordance with step 156, and the process branches to step 134 to test the c value.

Because c is less than or equal to 2, the total number of lines of operational parameters in the illustrated example, the process proceeds to step 136. With c=2 the operational parameters of line 2 shown in FIG. 10A are sent to various components of the timer circuit 30-*x*. Because RefID-2=T (the time domain reference), multiplexer 112-*x* sends the reference value Tm stored in save register 106-*x*-1 to adder circuit 120-*x*, which in turn adds reference value Tm to AMV-2=10, thus generating the relative match value RMV=Tm+10 in accordance with step 140. With RefID-2=T as shown, multiplexer 110-*x* selects the reference value Ts of register 102-*x*-1 as one input to ALU circuit 114-*x*. Multiplexer 122-*x* selects RMV=Tm+10 as the other input to ALU circuit 114-*x* since A/R-2 is set to R for relative. Line 2 includes match condition MC-2 set to "greater than or equal to," and as a result ALU circuit 114-*x* will assert a match pulse MP-x when Ts is greater than or equal to RMV=Tm+10. Presuming ALU circuit 114-*x* receives reference value Ts=RMV=Tm+10 at time t2, ALU circuit 114-*x* asserts a second match pulse MP-x, which in turn is transmitted to the R input of flip-flop 124-*x* via demultiplexer 126-*x* since the match-signal MS-x is set to ON. As a result, the match-signal MS-x toggles to OFF at time t2 in accordance with step 152, and save registers 106-*x* capture the reference values of registers 102-*x*, respectively, in accordance with step 154. Dynamic counter 110-*x* increments c to 3 since S/C-2=S in accordance with step 156, and the process branches to step 134 to test the c value. Because c is greater than 2, the example process ends.

In the second example of FIG. 10B, programmable memory device 86 includes 4 lines of operational parameters. With c previously set to 1, the operational parameters of line 1 are provided to various components of timer circuit 30-*x*, including reference match circuit 88-*x* and IE circuits 92-*x*. Because match-signal MS-x is initially reset to OFF, the first match pulse MP-x asserted by ALU circuit 114-*x* will be transmitted to the S input of flip-flop 124-*x* via demultiplexer 126-*x*. The A/R-1 bit of line 1 is set to A for absolute in FIG. 10B, which means that multiplexer 122-*x* selects absolute match value AMV-1=20 as one input for ALU circuit 114-*x*. RefID-1=720A, which means multiplexer 110-*x* initially selects the reference value 720As of register 102-*x*-3 as the second input to ALU circuit 114-*x* in accordance with step 144. Because MC-1 is set to "equal," ALU circuit 114 will assert a match pulse MP-x when the inputs to ALU circuit 114-*x* are equal. Presuming ALU circuit 114-*x* receives 720As=20 at time t1, ALU circuit 114-*x* will assert the match pulse MP-x, which toggles match-signal MS-x to ON in accordance with step 152. Shortly after time t1, the save registers 106-x capture the reference values of registers 102-x, respectively, in accordance with step 154. Dynamic counter 110-x then increments c from 1 to 2 since S/C-1=S in accordance with step 156, and the process branches to step 134 to test the c value.

Because c is less than or equal to 4, the total number of lines of operational parameters in the example, the process proceeds to step 136. With c=2 the operational parameters of line 2 shown in FIG. 10B are provided to various components of timer circuit 30-x, including reference match circuit 88-x and IE circuits 92-x. Because RefID-2=FRA (the free running angle reference value), multiplexer 112-x sends the reference value FRAm stored in register 106-x-2 to adder circuit 120-x, which in turn adds reference value FRAm to AMV-2=25, thus generating the relative match value RMV=FRAm+25 in accordance with step 140. With RefID-2=FRA as shown, multiplexer-x 110 selects the reference value FRAs of register 102-x-2 as one input to ALU circuit 114-x. Multiplexer 122-x selects RMV=FRAm+25 as the second input to ALU circuit 114-x since A/R-2 is set to R for relative. Line 2 includes match condition MC-2 set to "equal," and as a result ALU circuit 114-x will assert a match pulse MP-x when FRAs is equal to RMV=FRAm+25. Presuming ALU circuit 114-x receives FRAs=RMV=FRAm+25 at time t2, ALU circuit 114-x asserts a second match pulse MP-x, which in turn is transmitted to the R input of flip-flop 124-x via demultiplexer 126-x. As a result, the match-signal MS-x toggles to OFF at time t2 in accordance with step 152, and save registers 106-x capture the reference values of registers 102-x, respectively, in accordance with step 154. Dynamic counter 110-x increments c to 3 since S/C-2=S in accordance with step 156, and the process branches to step 134 to test the c value.

Because c is less than or equal to 4, the process proceeds to step 136. With c=3 the operational parameters of line 3 shown in FIG. 10B are provided to various components of timer circuit 30-x. Because RefID-3=T, multiplexer 112-x sends the reference value Tm stored in register 106-x-1 to adder circuit 120-x, which in turn adds reference value Tm to AMV-3=20, thus generating the relative match value RMV=Tm+20 in accordance with step 140. With RefID-3=T as shown, multiplexer 110-x selects the reference value Ts of register 102-x-1 as one input to ALU circuit 114-x. Multiplexer 122-x selects RMV=Tm+20 as the other input to ALU circuit 114-x since A/R-3 is set to R for relative. Line 3 includes match condition MC-3 set to "greater than or equal to," and as a result ALU circuit 114-x will assert a match pulse MP-x when Ts is greater than or equal to RMV=Tm+20. Presuming ALU circuit 114-x receives Ts=RMV=Tm+20 at time t3, ALU circuit 114-x asserts a third match pulse MP-x, which in turn is transmitted to the S input of flip-flop 124-x via demultiplexer 126-x. As a result, the match-signal MS-x toggles to ON at time t3 in accordance with step 152, and save registers 106-x capture the reference values of registers 102-x, respectively, in accordance with step 154. Dynamic counter 110-x increments c to 4 since S/C-3=S in accordance with step 156, and the process branches to step 134 to test the c value.

Because c is now equal than 4, the process proceeds to step 136. With c=4 the operational parameters of line 4 shown in FIG. 10B are sent to various components of timer circuit 30-x. Because RefID-4=V1 (the quantity of current flowing to coil 16 of FIG. 1), multiplexer 112-x sends the reference value V1m stored in register 106-x-4 to adder circuit 120-x, which in turn adds reference value V1m to AMV-4=10, thus generating the relative match value RMV=V1m+10 in accordance with step 140. With RefID-4=V1 as shown, multiplexer 110-x selects the reference value V1s of register 102-x-4 as one input to ALU circuit 114-x. Multiplexer 122-x selects AMV-4=10 as the other input to ALU circuit 114-x since A/R-4 is set to A. Line 4 includes match condition MC-4 set to "equal," and as a result ALU circuit 114-x will assert a match pulse MP-x when V1s is equal to AMV-4=10. Presuming ALU circuit 114-x receives V1s=AMV-4=10 at time t4, ALU circuit 114-x asserts a fourth match pulse MP-x, which in turn is transmitted to the R input of flip-flop 124-x via demultiplexer 126-x. As a result, the match-signal MS-x toggles to OFF at time t4 in accordance with step 152, and save registers 106-x capture the reference values of registers 102-x, respectively, in accordance with step 154. Dynamic counter 110 then decrements c to 3 since S/C-4=C in accordance with step 156.

Because S/C-4 is set to C for continuous, line selector value c will alternate between 3 and 4 and reference match circuit 88-x will enter a loop state. From time t4 on, the timing diagram of FIG. 10B shows MS-x repeatedly toggling in accordance with the operational parameters of alternating lines 3 and 4. When c first decrements to 3, the operational parameters of line 3 are resent to various components of timer circuit 30, including reference match circuit 88-x and IE circuits 92-x, in accordance with step 136. Presuming ALU circuit 114-x receives Ts=RMV=Tm+20 at time t5, ALU circuit 114-x asserts a fifth match pulse MP-x, just as it asserted the third match pulse MP-x at time t3. The fifth match pulse MP-x is transmitted to the S input of flip-flop 124-x via demultiplexer 126. As a result, the match-signal MS-x toggles to ON at time t5 in accordance with step 152, and save registers 106-x capture the reference values of registers 102-x, respectively, in accordance with step 154. Dynamic counter 110-x increments c to 4 since S/C-3=S in accordance with step 156, and the process proceeds as described in the immediately preceding paragraph, which eventually results with match-signal MS-x toggling to OFF at time t6 just as it did at time t4. Reference match circuit 88-x may continue in the loop state until it receives a stop signal from event logic circuit 90-x. It is noted that the time difference between t2 and t3 is the same as the time difference between t4 and t5 and the time difference between time t6 and time t7. However, the time difference between times t5 and t6 is less than the time difference between time t3 and t4. Because of the particular operational parameters shown in FIG. 10B, the length of time between t7 and t8 is greater than the length of time between times t5 and t6.

IE Circuits

Returning to FIG. 8, when given permission event logic circuit 90-x transmits its event-signal ES-x to other timing circuits 30 and I/O circuits 32 via event-signal bus 70. In general event logic circuit 90-x generates its event-signal ES-x as a function of the match-signal MS-x it receives from reference match circuit 88-x. Normally, the event-signal ES-x is equal to the match-signal MS-x. The state of the match-signal MS-x and/or the event-signal ES-x are sensitive to IE commands that event logic circuit 90-x receives from IE circuits 92-x as will be more fully described below.

Figure 11:
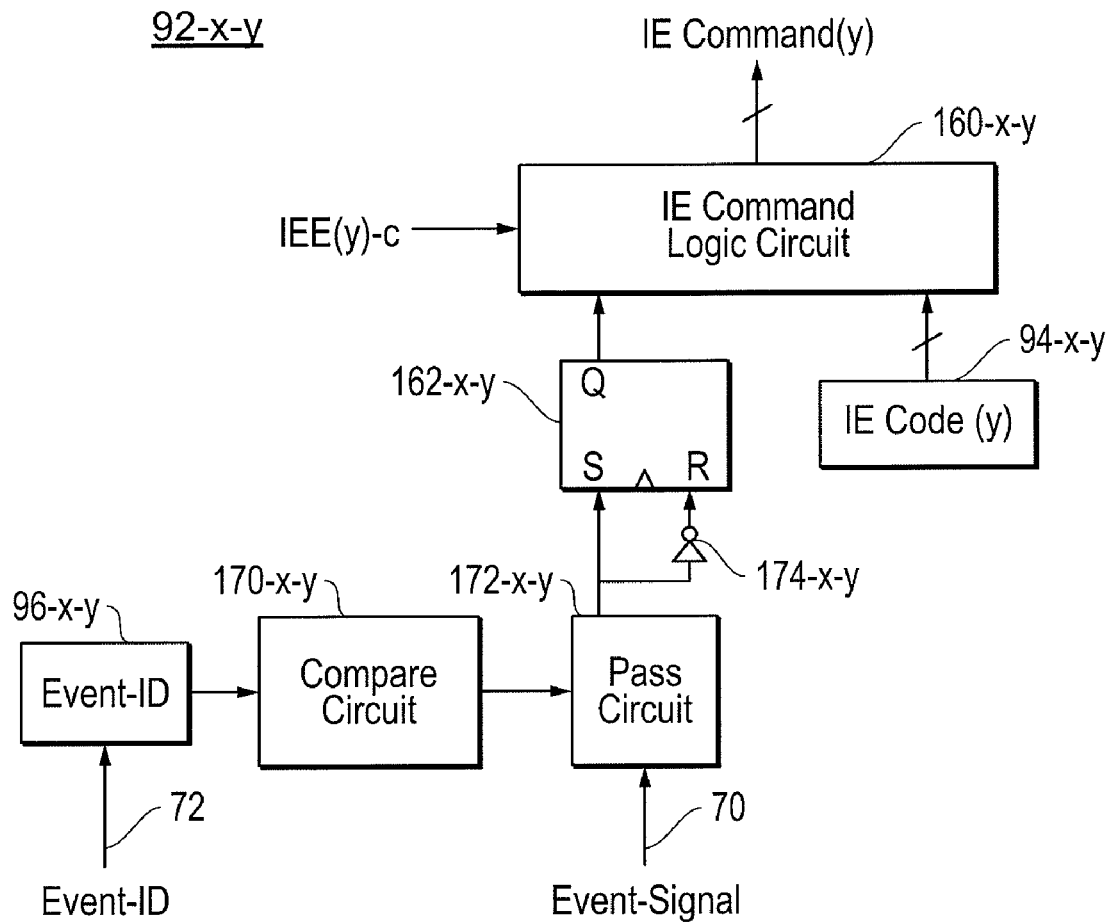
FIG. 11 illustrates in block diagram form, relevant components of an example input exception (IE) circuit employed in the timer circuit of FIGS. 7 and 8.

With continuing reference to FIG. 8, FIG. 11 illustrates in block diagram form, relevant components of an example IE circuit 92-x-y. The IE circuit 92-x-y includes an IE command logic 160-x-y coupled to receive input exception enablement bit IEE(y)-c from programmable memory device 86-x, a Q output of flip-flop 172-x-y, and an IE code from programmable register 94-x-y. IE circuit 92-x-y is configured to send one of many different types of IE commands to event logic circuit 90-x (not shown in FIG. 11) as will be more fully described below. Each of these IE commands, when received by event logic circuit 90-x may affect operation of the timer circuit 30 in general and event-signal ES-x in particular. It is noted that two or more of the IE circuits 92-x shown in FIG. 8 may receive and store different IE codes in their respective IE code registers 94-x. In another embodiment, two of the IE circuits may contain the same IE codes in their IE code registers 94-x.

IE code register 94-x-y receives and stores a multibit code IE code that was previously selected by CPU 40. In general, IE circuit 92-x-y sends or asserts an IE command corresponding to the IE code in register 94-x-y when both the input exception enablement bit IEE(y)-c and the Q output of flip-flop 162-x-y are ON. In one embodiment, IE command logic 160-x-y may include a memory device (not shown) that stores a table, which maps IE codes to respective IE commands. Table 1 below illustrates a mapping between example IE codes and their respective IE commands.

TABLE 1

| IE Code | IE Command |
|---------|------------|
| ST-H | Start on Assertion |
| RST-H | Restart on Assertion |
| STOP-H | Stop on Assertion |
| F-H | Force on Assertion |
| F-OFF-L | Force OFF on Termination |
| MASK | Mask |
| SPD | Suspend |
| PP | Postpone |
| IC | Increment Counter |

When the table (or the memory device that stores the table) receives an IE code from register 94-2-y, the table outputs an IE command that is mapped to the IE code, and IE command logic 160-x-y sends this mapped IE command to event logic circuit 90-x when both the input exception enablement bit IEE(y)-c and the Q output of flip-flop 162-x-y are ON. Other embodiments of IE command logic 160-x-y are contemplated.

IE circuit 92-x-y further includes event-ID register 96-x-y that receives and stores an event-ID selected by CPU 40. The event-ID of event-ID register 96-x-y is continuously compared by compare circuit 170-x-y to the event-IDs received on event-ID bus 72. When compare circuit 170-x-y detects a match, compare circuit 170-x-y asserts a pass signal which is provided to pass circuit 172-x-y. In one embodiment, pass circuit 172-x-y may take form in a simple transistor, the gate of which is coupled to the output of compare circuit 170-x-y. Regardless of the form, pass circuit 172-x-y passes the event-signal on event-signal bus 70 to the S input of flip-flop 162-x-y and to the input of inverter 174-x-y while the pass signal is asserted ON. A capacitor (not shown) could be added to hold the state of the event-signal at the S input and the input of inventor 174-x-y until these inputs are again coupled to event-signal bus 70 via pass circuit 172-x-y.

The event-bus, including the event-signal bus 70 and the event-ID bus 72, operate in a round robin fashion; timer circuits 30 transmit their event-signal/event-ID, regardless of event-signal state, in sequential fashion beginning with timer circuit 30-1 and ending with timer circuit 30-m. One or more of the timer circuits 30 may be programmed, as will be more fully described below, to transmit an event-ID that equals the event-ID programmed into, for example, register 96-1-1 of IE circuit 92-1-1. To illustrate, presume timer circuit 30-2 is configured to transmit event-ID=DDA, along with its event-signal ES-2, when given permission by event-bus controller 38. Further, presume register 96-1-1 of IE circuit 92-1-1 stores event-ID=DDA. When timer circuit 30-2 concurrently transmits ES-2 and DDA to pass circuit 172-1-1 and compare circuit 170-1-1, respectively, pass circuit 172-1-1 passes event-signal ES-2 since compare circuit 172-1-1 finds a match between the DDA event-ID it receives and the DDA event-ID in register 96-1-1.

Timer circuits 30 will transmit their respective event-signals for one system clock cycle at regularly scheduled times in accordance with the round robin process by which event-bus controller 38 grants permission. Like the flip-flops of the I/O circuits 32, the minimum time period during which flip-flop 162-x-y asserts the Q output in the ON state, is defined by m/(system clock frequency) where m is the total number of timer circuits 30. The minimum time period can be reduced if the system clock frequency is increased.

Event Logic Circuit

As noted, IE command logic 160-x-y sends or asserts an IE command corresponding to the IE code in register 94-x-y only when both the exception enablement bit IEE(y)-c of programmable memory device 86-x and the Q output of flip-flop 162-x-y are ON. At any point in time, event logic circuit 90-x may receive one or more IE commands from IE circuits 92-x.

Event logic circuit 90-x may take form in hardware, software or a combination of hardware and software. In one embodiment event logic circuit 90-x may include a processor that processes received IE commands in accordance with executable instructions stored in memory (not shown). In another embodiment, event logic circuit 90-x may take form in a field programmable gate array. In a preferred embodiment, event logic circuit 90-x lacks a processor and instructions executable by the processor; rather event logic circuit 90 is a fast, hardwired circuit that includes, for example, interconnected logic gates, registers, flip-flops, etc.

Event logic circuit 90-x responds differently to different IE commands from IE circuits 92-x. With continuing reference to FIGS. 8, 9, and 11, FIGS. 12A-12F illustrate timing diagrams that show relevant aspects of event logic circuit 90-x's operation in response to assertion of example IE commands.

Start IE Command

In general, when event logic circuit 90-x receives a start IE command, or any variation thereof, event logic circuit 90-x may send a start signal to ALU circuit 114-x and dynamic counter circuit 116-x, which in turn activates ALU circuit 114-x and sets c to 1. In addition event logic circuit 90-x may send a reset signal to flip-flop 124-x, which resets match-signal MS-x to OFF. Thereafter, the reference match circuit 88-x may begin operating in accordance with the process shown in FIG. 9.

The present invention contemplates multiple variations of the start IE command. For example, in response to receiving a "start-on-assertion" IE command, event logic circuit 90-x will immediately send the start and reset signals when one of the IE circuits 92-x first asserts the start-on-assertion IE command. In response to receiving a "start-on-assertion-OFF" IE command, event logic circuit 90-x will send the start and reset signals only if event-signal ES-x is in the OFF state when the IE circuit 92-x first asserts the start-on-assertion-OFF IE command.

Figure 12A:
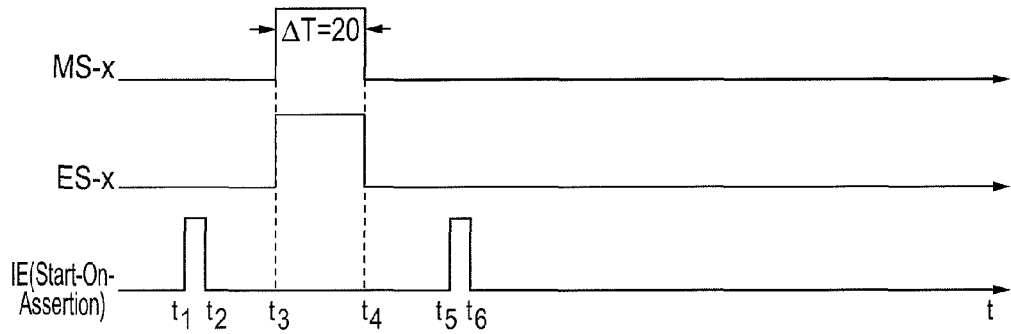
FIGS. 12A-12G are timing diagrams that show relevant aspects of an event logic circuit's operation in response to assertion of example IE commands.

FIG. 12A illustrate timing diagrams that show relevant aspects of event logic circuit 90-x and reference match circuit 88-x's operation in response to assertion of a start-on-assertion IE command. For purposes of explanation, it will be presumed that IE circuit 92-x-0 is programmed to assert the start-on-assertion IE command. FIG. 12A illustrates timing diagrams for: the match-signal MS-x generated by reference match circuit 88-x, the event-signal ES-x generated by event logic circuit 90-x, and the assertion of the start-on-assertion IE command by IE circuit 92-x-0. FIG. 12A also shows example operational parameters, including exception enablement bits IEE(0)-IEE(3), of memory device 86-*x*. It is noted the timing diagrams of FIGS. 12A-12F do not show the IE commands, rather they show the time periods when the IE commands are asserted.

In general, none of the IE circuits 92-*x*-0-92-*x*-3 can assert an IE command unless its input exception enablement bit is ON. As shown in FIG. 12A, the input exception enablement bits are set to 0=OFF except for IEE(0)-1=1=ON. With c equal to 1, IE circuit 92-*x*-0 is enabled to assert the start-on-assertion IE command since IEE(0)-1 is set to 1=ON. However, IE circuit 92-*x*-0 will not be enabled to assert the start-on-assertion IE command after c is incremented to 2 since IEE(0)-2 is set to 0=OFF.

At times t1 and t5, IE circuit 92-*x*-0 receives an event-signal that is ON along with an event-ID that matches the event-ID in register 96-*x*-0, and as a result IE circuit 92-*x*-0 asserts the start-on-assertion IE command as shown. At times t2 and t6, IE circuit 92-*x*-0 receives an event-signal that is OFF along with event-ID that matches the event-ID in register 96-*x*-0, and as a result IE circuit 92-*x*-0 terminates the assertion of the start-on-assertion IE command as shown.

Event logic circuit 90-*x* responds to a start-on-assertion IE command by sending a start signal to ALU circuit 114-*x* and dynamic counter circuit 116-*x*, and by sending a reset signal to flip-flop 124-*x*. Thereafter reference match circuit 88-*x* begins to operate in accordance with the process shown in FIG. 9. During the course of operation, reference match circuit 88-*x* generates the match-signal MS-x shown in FIG. 12A. The timing diagrams of FIG. 12A were drawn with the presumption that the value of 720As is greater than or equal to AMV-1=300 at time t3, and that the value of Ts is greater than or equal to RMV=Tm+20 at time t4. As such, reference match circuit 88-*x* asserts the match-signal MS-x between t3 and t4, and because the event-signal ES-x is presumed equal to the match-signal MS, event logic circuit 90 asserts the event-signal ES-x at the same time. A reassertion of the start-on-assertion IE command, or any variation thereof, will have no effect, regardless of the input exception enablement bits IEE(0)-IEE(3), unless event logic circuit 90 receives a variation of the stop IE command in the intervening period between successive start-on-assertion IE commands. Again, event logic circuit 90-*x* responds at time t1, the time when the start-on-assertion IE command is first asserted.

Restart IE Command

In general, when event logic circuit 90-*x* receives a restart IE command, or any variation thereof, event logic circuit 90-*x* sends a start signal to ALU circuit 114-*x* and dynamic counter circuit 116-*x*, which in turn activates ALU circuit 114-*x* and sets c to 1. In addition event logic circuit 90-*x* sends a reset signal to flip-flop 124-*x*, which resets match-signal MS-x to OFF. Thereafter, the reference match circuit 88-*x* may begin operating in accordance with the process shown in FIG. 9.

The present invention contemplates multiple variations of the restart IE command. For example, in response to receiving a "restart-on-assertion" IE command, event logic circuit 90-*x* will immediately send the start and reset signals when one of the IE circuits 92-*x* first asserts the restart-on-assertion IE command. In response to receiving a "restart-on-termination-OFF" IE command, event logic circuit 90-*x* will send the start and reset signals only if event-signal ES-x is in the OFF state when IE circuit 92-*x*-*y* terminates the assertion of the restart-on-termination-OFF IE command.

Figure 12B:
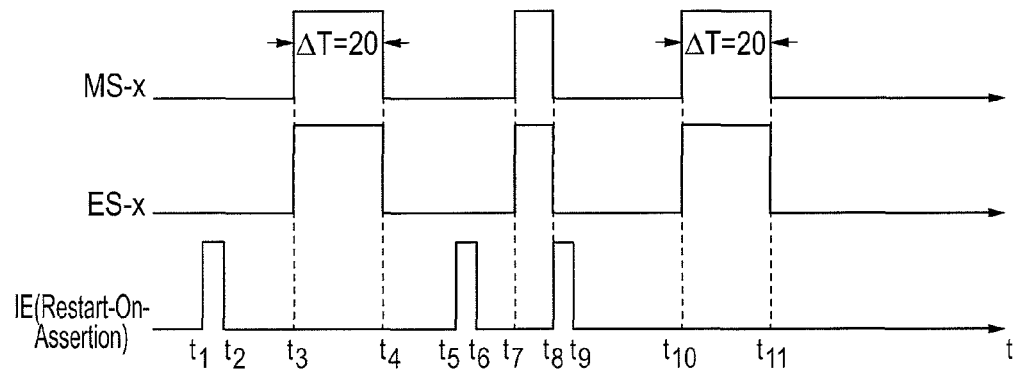

FIG. 12B illustrate timing diagrams that show relevant aspects of event logic circuit 90-*x* and reference match circuit 88-*x*'s operation in response to the assertion of a restart-on-assertion IE command. The start-on-assertion and restart-on-assertion IE commands result in similar effects; however, unlike the start-on-assertion IE command, event logic circuit 90-*x* reacts to successive assertions of the restart-on-assertion IE command by resending the start and reset signals to match circuit 88-*x*.

For purposes of explanation, it will be presumed that IE circuit 92-*x*-0 is programmed to assert the restart-on-assertion IE command. FIG. 12B illustrates timing diagrams for: the match-signal MS-x generated by reference match circuit 88-*x*, the event-signal ES-x generated by event logic circuit 90-*x*, and the assertion of the restart-on-assertion IE command by IE circuit 92-*x*-0. FIG. 12B also shows example operational parameters of programmable memory device 86-*x*, including exception enablement bits IEE(0)-IEE(3).

As shown in FIG. 12B, the input exception enablement bits are set to 0=OFF except for IEE(0)-1 and IEE(0)-2. With c equal to either 1 or 2, IE circuit 92-*x*-0 is enabled to assert the restart-on-assertion IE command. At times t1, t5, and t8, IE circuit 92-*x*-0 receives an event-signal set to ON along with an event-ID that matches the event-ID in register 96-*x*-0, and as a result IE circuit 92-*x*-0 asserts the restart-on-assertion IE command as shown. At times t2, t6, and t9, compare circuit 170-*x*-0 receives an event-signal set to OFF along with an event-ID that matches the event-ID in register 96-*x*-0, and as a result, IE circuit 92-*x*-0 terminates the assertion of the restart-on-assertion IE command as shown.

Event logic circuit 90-*x*-0 responds to assertion of the restart-on-assertion IE command by sending a start signal to ALU circuit 114-*x* and dynamic counter circuit 116-*x* in addition to sending a reset signal to flip-flop 124-*x*. Thereafter reference match circuit 88-*x* begins to operate in accordance with the process shown in FIG. 9. During the course of operation, reference match circuit 88-*x* generates the match-signal MS-x shown in FIG. 12B. The timing diagrams of FIG. 12B were drawn with the presumption that the value of 720As is greater than or equal to AMV-1=300 at time t3, and that the value of Ts is greater than or equal to RMV=Tm+20 at time t4. As such, reference match circuit 88-*x* asserts the match-signal MS-x between t3 and t4, and with event-signal ES-x presumed equal to the match-signal MS-x, event logic circuit 90-*x*-0 asserts the event-signal ES-x at the same time.

When IE circuit 92-*x*-0 reasserts the restart-on-assertion IE command at times t5 and t8, event logic circuit 90 resends the start signal to ALU circuit 114-*x* and dynamic counter circuit 116-*x* in addition to sending the reset signal to flip-flop 124-*x*. Thereafter match circuit 88-*x* restarts operation in accordance with the process shown in FIG. 9 at those times. The timing diagrams of FIG. 12B were drawn with the presumption that reference value 720As is greater than or equal to 300 at times t7 and t10, and that reference value Ts selected in step 144 is greater than or equal to Tm+20 at time t11. It is noted that IE circuit 92-*x*-0 asserts the restart-on-assertion IE command and event logic circuit 90-*x* resends the start and reset signals before reference match circuit 88-*x* completes the process it started at time t8, and as a result, both the match-signal MS-x and the event-signal ES-x toggle OFF.

Stop IE Command

For purposes of explanation only, all programmed timer circuits 30 will have at least one IE circuit 92-*x*-*y* that is programmed to assert the start-on-assertion or restart-on-assertion IE command. However, more than one of the IE circuits 92-*x* can be concurrently programmed by CPU 40 and enabled by input exception bits. For example, a timer circuit 30-*x* could have separate IE circuits 92-*x* that are programmed to assert the start-on-assertion IE command and a variation of the stop IE command. In general, when event logic circuit 90-*x* receives any variation of a stop IE command, event logic circuit 90-*x* sends a stop signal to ALU circuit 114-*x* and dynamic counter circuit 116-x, which in turn deactivates ALU circuit 114-x and sets c to 1. In addition event logic circuit 90-x sends a reset signal to flip-flop 124-x, which resets match-signal MS-x, and thus ES-x, to OFF.

The present invention contemplates multiple variations of the stop IE command. For example, in response to receiving a "stop-on-assertion" IE command, event logic circuit 90-x will immediately send the stop and reset signals when one of the IE circuits 92-x first asserts the stop-on-assertion IE command. In response to receiving a "stop-on-assertion-ON" IE command, event logic circuit 90-x will send the stop and reset signals only if event-signal ES-x is ON when IE circuit 92-x-y first asserts the stop-on-assertion-ON IE command.

Figure 12C:
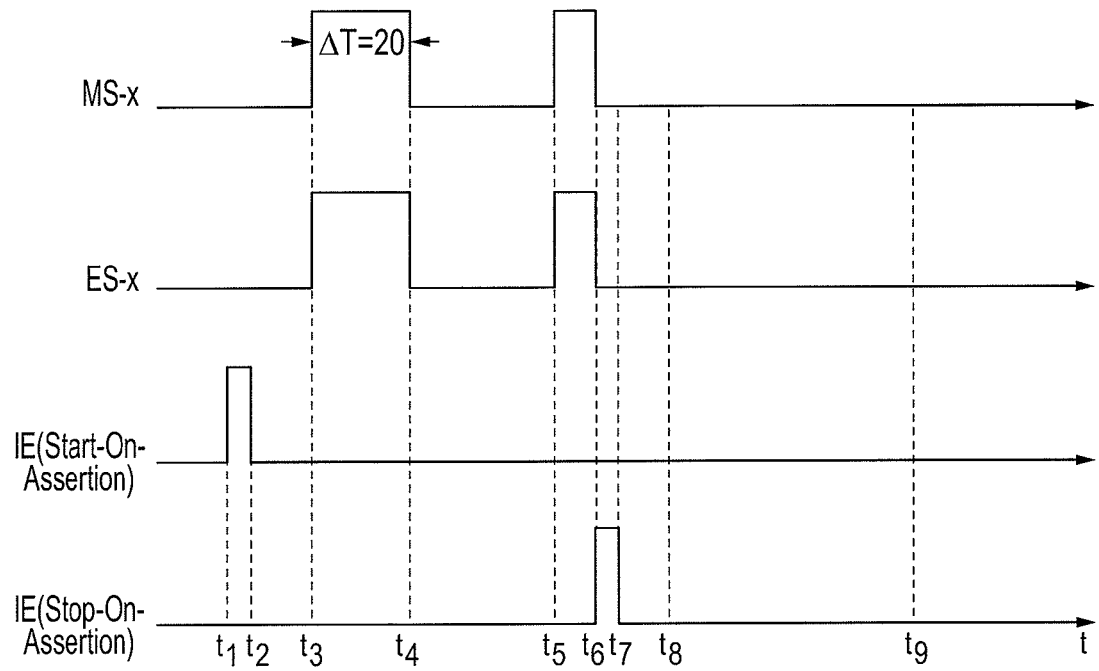

FIG. 12C illustrate timing diagrams that show relevant aspects of reference match circuit 88-x and event logic circuit 90-x's operation in response to the assertion of a start-on-assertion IE and a stop-on-assertion IE command. For purposes of explanation, it will be presumed that IE circuit 92-x-0 and 92-x-1 are programmed to assert the start-on-assertion and stop-on-assertion IE commands, respectively.

FIG. 12C illustrates timing diagrams for: the match-signal MS-x generated by reference match circuit 88-x, the event-signal ES-x generated by event logic circuit 90-x, the assertion of the start-on-assertion IE command by IE circuit 92-x-0, and the assertion of the stop-on-assertion IE command by IE circuit 92-x-1. FIG. 12C also shows example operational parameters of programmable memory device 86-x, including exception enablement bits IEE(0) IEE(3).

As shown in FIG. 12C, the input exception enablement bits are set to 0=OFF except for IEE(0)-1, IEE(1)-1, IEE(0)-2 and IEE(1)-2. With c is equal to either 1 or 2, IE circuit 92-x-0 is enabled to assert the start-on-assertion IE command, and IE circuit 92-x-1 is enabled to assert the stop-on-assertion IE command. At time t1 IE circuit 92-x-0 simultaneously receives an event-signal set to ON and an event-ID that matches the event-ID in register 96-x-0, and as a result, IE circuit 92-x-0 asserts the start-on-assertion IE command as shown. At times t2, IE circuit 92-x-0 receives an event-signal set to OFF and event-ID that matches the event-ID in register 96-x-0, and as a result, IE circuit 92-x-0 terminates the assertion of the start-on-assertion IE command. At time t5 IE circuit 92-x-1 receives an event-signal set to ON and an event-ID that matches the event-ID in register 96-x-1, and as a result, IE circuit 92-x-1 asserts the stop-on-assertion IE command as shown. At time t7, IE circuit 92-x-1 receives an event-signal set to OFF and an event-ID that matches the event-ID in register 96-x-1, and as a result, IE circuit 92-x-1 terminates the assertion of the stop-on-assertion IE command as shown.

Event logic circuit 90-x-0 responds to the start-on-assertion IE command by sending a start signal to ALU circuit 114-x and dynamic counter circuit 116-x, and by sending a reset signal to flip-flop 124-x. Thereafter reference match circuit 88-x begins to operate in accordance with the process shown in FIG. 9. During the course of operation, reference match circuit 88-x generates the match-signal MS-x shown in FIG. 12C. The timing diagrams of FIG. 12C were drawn with the presumption that reference value 720As is greater than 300 at time t3, and that reference value Ts selected in step 144 is greater than Tm+20 at time t4. As such, reference match circuit 88-x asserts the match-signal MS-x between t3 and t4 as shown, and because the event-signal ES-x is presumed equal to the match-signal MS-x, event logic circuit 90-x-0 asserts the event-signal ES-x at the same time.

The S/C-2 bit in programmable memory device 86-x is set to C for continuous, which means reference match circuit 88-x will enter a loop state in accordance with the process of FIG. 9 as described above. The timing diagrams of FIG. 12C were drawn with the presumption that reference value 720As is greater than 300 at time t5, and as a result reference match circuit 88-x toggles the match-signal MS-x from OFF to ON as shown. However, at time t6 IE circuit 92 asserts the stop-on-assertion IE command, and event logic circuit 90-x in turn sends a stop signal to ALU circuit 114-x and dynamic counter circuit 116-x. Event logic circuit 90-x also sends a reset signal to flip-flop 124-x, which in turn toggles the match-signal MS-x, and thus the event-signal ES-x, from ON to OFF as shown. Because ALU circuit 114-x is in the inactive state in response to receiving the stop signal and will not generate a match pulse MP-x, the match-signal MS-x, and thus the event-signal ES-x, will remain in the OFF state until event logic circuit 90-x receives a subsequent start-on-assertion IE command.

Force IE Command

In general, when event logic circuit 90-x receives a force IE command, or any variation thereof, event logic circuit 90-x sends a force signal to ALU circuit 114-x, and ALU circuit 114-x responds by generating a match pulse MP-x, which may toggle MS-x, increment C and trigger save registers 106-x. Thereafter, the reference match circuit 88-x may begin or continue operating in accordance with the process shown in FIG. 9.

The present invention contemplates multiple variations of the force IE command. For example, in response to receiving a "force-on-assertion" IE command, event logic circuit 90-x will immediately send the force signal when one of the IE circuits 92-x first asserts the force-on-assertion IE command. In response to receiving a "force-OFF-on-termination" IE command, event logic circuit 90-x will send the force signal only if event-signal ES-x is ON when IE circuit 92-x-y terminates the assertion of the force-OFF-on-termination IE command. In response to receiving a "force-ON-on-termination" IE command, event logic circuit 90-x will send the force signal only if event-signal ES-x is OFF when IE circuit 92-x-y terminates the assertion of the force-OFF-on-termination IE command. In response to receiving a "force-OFF-on-assertion" IE command, event logic circuit 90-x will send the force signal only if event-signal ES-x is ON when IE circuit 92-x-y first asserts the force-OFF-on-assertion IE command.

Figure 12D:
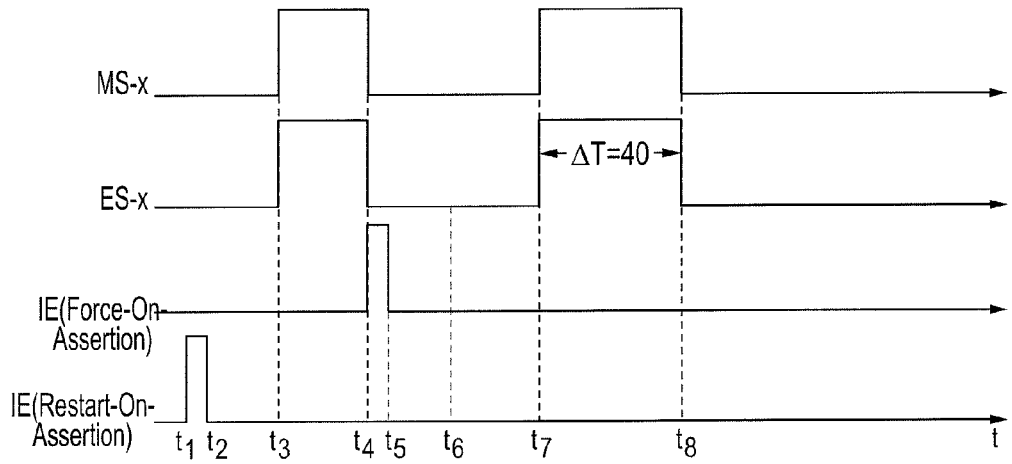

FIG. 12D illustrate timing diagrams that show relevant aspects of reference match circuit 88-x and event logic circuit 90-x's operation in response to the assertion of a restart-on-assertion IE and a force-on-assertion IE command. For purposes of explanation, it will be presumed that IE circuit 92-x-0 and 92-x-1 are programmed to assert the restart-on-assertion and force-on-assertion IE commands, respectively.

FIG. 12D illustrates timing diagrams for: the match-signal MS-x generated by reference match circuit 88-x, the event-signal ES-x generated by event logic circuit 90-x, the assertion of the restart-on-assertion IE command by IE circuit 92-x-0, and the assertion of the force-on-assertion IE command by IE circuit 92-x-1. FIG. 12D also shows example operational parameters of programmable memory device 86-x, including exception enablement bits IEE(0) IEE(3).

As shown in FIG. 12D, the input exception enablement bits are set to 0=OFF except for IEE(0)-1, IEE(1)-1, IEE(0)-2 and IEE(1)-2. With c is equal to either 1 or 2, IE circuits 92-x-0 and IE circuit 92-x-1 are enabled to assert the restart-on-assertion and force-on-assertion IE commands, respectively. At time t1 IE circuit 92-x-0 receives an event-signal set to ON in addition to an event-ID that matches the event-ID in register 96-x-0, and as a result, IE circuit 92-x-0 asserts the restart-on-assertion IE command as shown. At time t2, IE circuit 92-x-0 receives an event-signal set to OFF in addition to an event-ID that matches the event-ID in register 96-*x*-0, and as a result, IE circuit 92-*x*-0 terminates the assertion of the restart-on-assertion IE command as shown. At time t4 IE circuit 92-*x*-1 receives an event-signal set to ON in addition to an event-ID that matches the event-ID in register 96-*x*-1, and as a result, IE circuit 92-*x*-10 asserts the force-on-assertion IE command shown. At time t5, IE circuit 92-*x*-1 receives an event-signal set to OFF in addition to an event-ID that matches the event-ID in register 96-*x*-1, and as a result, IE circuit 92-*x*-1 terminates assertion of the force-on-assertion IE command at t5 as shown.

Event logic circuit 90-*x* responds to assertion of the restart-on-assertion IE command by sending a start signal to ALU circuit 114-*x* and dynamic counter circuit 116-*x*, and by sending a reset signal to flip-flop 124-*x*. Thereafter reference match circuit 88-*x* begins to operate in accordance with the process shown in FIG. 9. During the course of operation, reference match circuit 88-*x* generates the match-signal MS-x shown in FIG. 12D. The timing diagrams of FIG. 12D are drawn with the presumption that reference value 720As is greater than or equal to 300 at time t3, and that reference value Ts is greater than or equal to Tm+40 at time t6. As such, reference match circuit 88-*x* toggles the match-signal MS-x to ON at time t3, and because the event-signal ES-x is presumed equal to the match-signal MS-x, event logic circuit 90-*x*-0 toggles the event-signal ES-x to ON at the same time as shown.

Normally, reference match circuit 88-*x* would toggle the match-signal MS-x to OFF at time t6. However, because the force-on-assertion IE command is asserted at time t4, event logic circuit 90-*x* sends a force signal to ALU circuit 114-*x*, and ALU circuit 114-*x* responds by generating a match pulse MP-x, which causes the match-signal MS-x to toggle OFF, and as shown, the match-signal MS-x toggles before t6. The match pulse MP-x also causes dynamic counter circuit 116-*x* to increment c to 2, and the save registers 106-*x* to capture the reference values in registers 102-*x*, respectively.

The S/C-2 bit in programmable memory device 86-*x* is set to C for continuous, which means that reference match circuit 88-*x* will enter a loop state in accordance with FIG. 9 as described above. The timing diagrams of FIG. 12D are drawn with the presumption that reference value 720As is greater than or equal to 300 at time t7, and that reference value Ts selected in step 144 is greater than or equal to Tm+40 at time t8. As such, reference match circuit 88-*x* asserts the match-signal MS-x to ON between t7 and t8 as shown; event-signal ES-x is asserted ON at these times also since event-signal ES-x is presumed to be equal to match-signal MS-x.

Mask IE Command

In general, event-signal ES-x generated by event logic circuit 90-*x* is presumed equal to the match-signal MS-x. However, during the time period when event logic circuit 90-*x* receives a mask IE command, event-signal ES-x may not be equal to match-signal MS-x. In general, when event logic circuit 90-*x* receives a mask IE command, reference match circuit 88-*x* continues to operate in accordance with the process shown in FIG. 9. Event logic circuit 90-*x*, however, masks transitions of the match-signal MS-x from OFF to ON or ON to OFF. It is noted that match-signal MS-x transitions can be masked even when the transitions occur as a result of, for example, event logic circuit 90-*x* receiving a force-on-assertion IE command or a restart-on-assertion IE command.

Figure 12E:
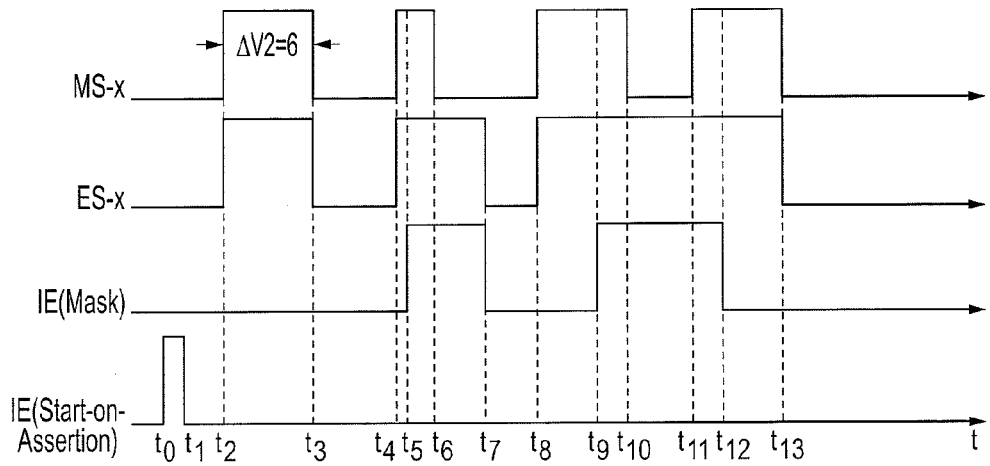

FIG. 12E illustrate timing diagrams that show relevant aspects of reference match circuit 88-*x* and event logic circuit 90-*x*'s operation in response to the assertion of a start-on-assertion IE and a mask IE command. For purposes of explanation, it will be presumed that IE circuit 92-*x*-0 and 92-*x*-1 are programmed to assert the start-on-assertion and mask IE commands, respectively. The present invention contemplates variations of the mask IE command.

FIG. 12E illustrates timing diagrams for: the match-signal MS-x generated by reference match circuit 88-*x*, the event-signal ES-x generated by event logic circuit 90-*x*, the assertion of the start-on-assertion IE command by IE circuit 92-*x*-0, and the assertion of the mask IE command by IE circuit 92-*x*-1. FIG. 12D also shows example operational parameters of programmable memory device 86-*x*, including exception enablement bits IEE(0)-IEE(3).

As seen in FIG. 12E, match-signal MS-x toggles at times t2, t3, t4, t6, t8, t10, t11, and t13. The IE circuit 92, however, asserts the mask IE command between times t5 and t7 and between times t9 and t12. As such, the event-signal generated by event logic circuit 90 does not toggle with match-signal MS-x at times t6, t10, and t11.

Suspend IE Command

In general, while event logic circuit 90-*x* receives a suspend IE command, or a variation thereof, event logic circuit 90-*x* suspends operation of ALU circuit 114-*x*. In one embodiment, event logic circuit 90 suspends ALU circuit 114-*x* by (1) sending a stop signal to ALU circuit 114-*x*, but not to dynamic counter circuit 116-*x*, when the suspend IE command is first asserted by one of the IE circuit 92-*x*, and (2) sending a start signal to ALU circuit 114-*x*, but not to dynamic counter circuit 116-*x*, when assertion of the suspend IE command is subsequently terminated. Variations of the mask IE command are contemplated.

Figure 12F:
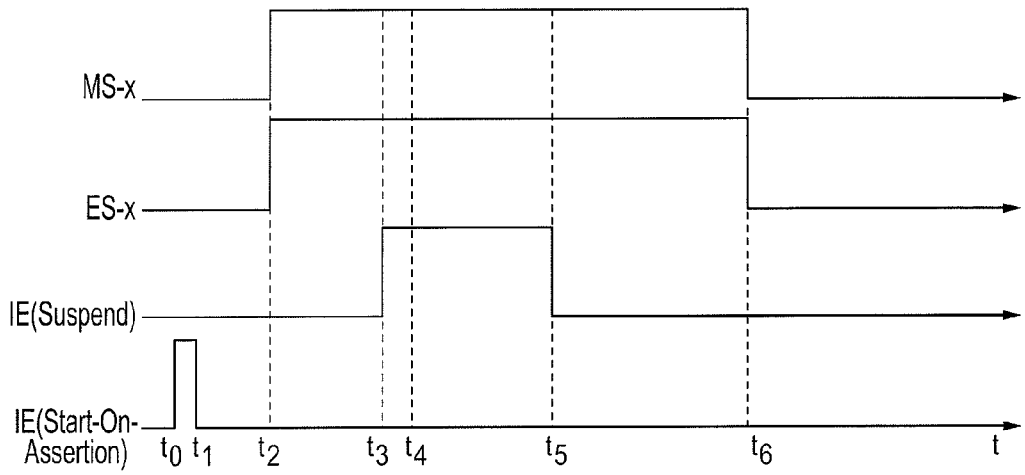

FIG. 12F illustrate timing diagrams that show relevant aspects of reference match circuit 88-*x* and event logic circuit 90-*x*'s operation in response to the assertion of a start-on-assertion IE and a suspend IE command. For purposes of explanation, it will be presumed that IE circuit 92-*x*-0 and 92-*x*-1 are programmed to assert the start-on-assertion and suspend IE commands, respectively.

FIG. 12F illustrates timing diagrams for the match-signal MS-x generated by reference match circuit 88-*x*, the event-signal ES-x generated by event logic circuit 90-*x*, the assertion of the start-on-assertion IE command by IE circuit 92-*x*-0, and the assertion of the suspend IE command by IE circuit 92-*x*-1. FIG. 12F also shows example operational parameters of programmable memory device 86-*x*, including exception enablement bits IEE(0)-IEE(3).

Event logic circuit 90-*x* responds to the start-on-assertion IE command by sending a start signal to ALU circuit 114-*x* and dynamic counter circuit 116-*x*, and by sending a reset signal to flip-flop 124-*x*. Thereafter reference match circuit 88-*x* begins to operate in accordance with the process shown in FIG. 9. During the course of operation, reference match circuit 88-*x* generates the match-signal MS-x shown in FIG. 12F. The timing diagrams of FIG. 12F were drawn with the presumption that reference value 720As is greater than or equal to 300 at time t2, and that reference value Ts selected in step 144 is greater than or equal to Tm+20 at time t4. As such, reference match circuit 88-*x* toggles the match-signal MS-x to ON at time t2, and because the event-signal ES-x is presumed equal to the match-signal MS-x, event logic circuit 90-*x* toggles the event-signal ES-x to ON at the same time. Normally, reference match circuit 88-*x* would toggle match-signal MS-x to OFF at time t4. However, IE circuit 92-*x*-1 asserts the suspend IE command at time t3, and as a result event logic circuit 90 sends the stop signal to deactivate ALU circuit 114-*x*. Because ALU circuit 114-*x* is in the inactive mode, ALU circuit 114-*x* will not assert a match pulse MP-x at time t4, and match-signal MS-x will not toggle to OFF at that time. At time t5, IE circuit 92-*x*-1 terminates the suspend IE command, and as a result event logic circuit 90 sends the start signal to reactivate ALU circuit 114-x. At time t6, reference value Ts selected in step 144 is again greater than or equal to Tm+20, and as a result both match-signal MS-x and event-signal ES-x toggle to the OFF state.

Postpone IE Command

The postpone IE command is similar to the mask IE command. In general, when event logic circuit 90-x receives a postpone IE command, reference match circuit 88-x continues to operate in accordance with the process shown in FIG. 9. Event logic circuit 90-x, however, masks transitions of the match-signal MS-x from OFF to ON or ON to OFF. In contrast to mask IE command, when assertion of the postpone IE command is terminated, the event-signal ES-x will assume the state of match-signal MS. Match-signal MS-x transitions can be masked even when the transitions occur as a result of, for example, event logic circuit 90-x receiving a force-on-assertion IE command or a restart-on-assertion IE command. The present invention contemplates multiple variations of the postpone IE command.

Increment Count IE Command

Event logic circuit 90-x may receive and store the maximum event count value (MECV). This value may be stored in a register (not shown) of event logic circuit 90-x. Event logic circuit 90-x may also include a compare circuit (not shown) that continuously compares MECV with an event counter value (ECV) that is maintained by event logic circuit 90-x. Each time event logic circuit 90-x receives an increment count IE command from one of the IE circuits 92-x-0-92-x-3, event logic circuit 90-x increments ECV by one. When the value of ECV compares equally to MECV, event logic circuit 90-x toggles event-signal ES-x, and event logic circuit 90-x will maintain event-signal ES-x in this toggled state at least until event logic circuit 90-x receives a start IE command, a restart IE command, or any variation thereof, at which point event logic circuit 90-x will reset ECV to 0.

Figure 12G:
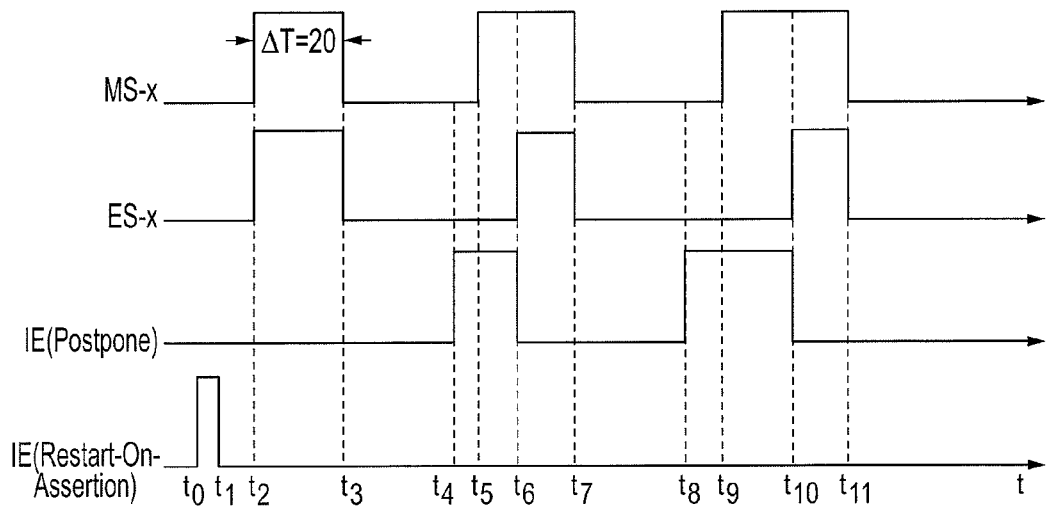

FIG. 12G illustrate timing diagrams that show relevant aspects of reference match circuit 88-x and event logic circuit 90-x's operation in response to the assertion of a start IE and a postpone IE command. For purposes of explanation, it will be presumed that IE circuit 92-x-0 and 92-x-1 are programmed to assert the restart-on-assertion and postpone IE commands, respectively.

FIG. 12G illustrates timing diagrams for the match-signal MS-x generated by reference match circuit 88-x, the event-signal ES-x generated by event logic circuit 90-x, the assertion of the restart-on-assertion IE command by IE circuit 92-x-0, and the assertion of the postpone IE command by IE circuit 92-x-1. FIG. 12G also shows example operational parameters of programmable memory device 86-x, including exception enablement bits IEE(0)-IEE(3).

As seen in FIG. 12G, match-signal MS-x toggles at times t2, t3, t5, t7, t9, and t11. The IE circuit 92-x-1, however, asserts the postpone IE command between times t4 and t6 and between times t8 and t10. As such, the event-signal ES-x generated by event logic circuit 90 does not toggle with match-signal MS-x at times t5 and t9.

ASC Circuit

Figure 13:
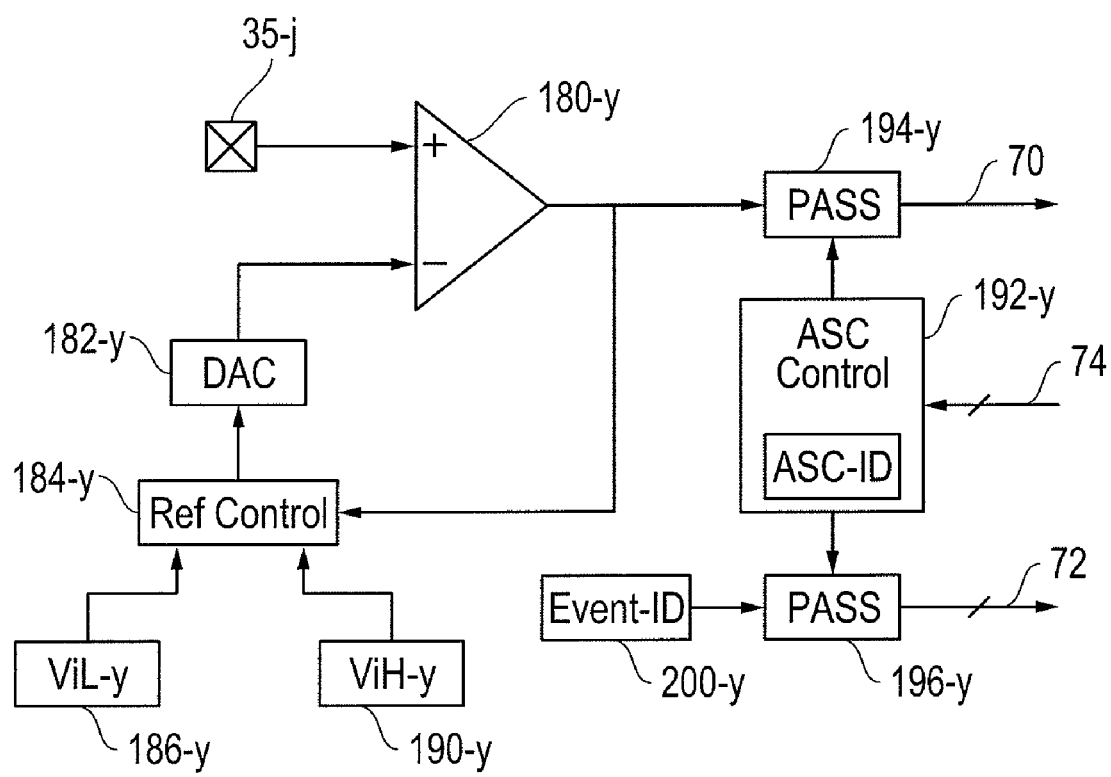
FIG. 13 illustrates relevant components of an example analog comparator circuit employed in the control system of FIG. 1.

With continuing reference to FIG. 1, ASC circuits 33 when programmed, generate event-signals, which are subsequently transmitted to timer circuits 30 via event bus 34. FIG. 13 illustrates relevant components of an example ASC circuit 33-y. All ASC circuits 33 are assumed to include the components shown in FIG. 13, it being understood that in alternative embodiments several ASC circuits 33 may take differing forms.

ASC circuit 33-y includes an analog comparator 180-y, which has inverting and non-inverting inputs labeled simply "−" and "+" in FIG. 13. The inverting input is coupled to receive an analog reference signal V− from a digital-to-analog convertor (DAC) 182, while the non-inverting input is coupled to receive an analog sensor signal V+ from a sensor (not shown in FIG. 13) via I/O pad 35-j. Analog comparator 180-y generates an event-signal at its output in response to comparing the analog sensor signal V+ and the analog reference signal V−. The output of analog comparator 180-y is coupled to an input of a reference control circuit 184-y and to pass circuit 194-y. Although not shown, a voltage dividing circuit may be imposed between I/O pad 35-j and the non-inverting input in order to reduce the magnitude of the analog sensor signal to a level that is in an effective range for analog comparator 180-y.

Reference control circuit 184-y is coupled to programmable registers 186-y and 190-y, which in turn store digital comparator values ViL-y and ViH-y, respectively, received from CPU 40. As noted above, CPU 40 (see FIG. 1) can generate comparator values such as ViL-y and ViH-y as a function of multibit engine control and/or status values. Comparator values ViL-y and ViH-y are distinct from each other. The values of ViL generated for respective ASC circuits 33 may be distinct from each other, and the values of ViH generated for respective ASC circuits 33 may be distinct from each other. Once generated, comparator values ViL-y and ViH-y are transmitted to programmable registers 186-y and 190-y, respectively, via communication path 42. As operating conditions change, CPU 40 may update programmable registers 186-y and 190-y with new comparator values.

Reference control circuit 184-y selects either ViL-y or ViH-y for conversion by DAC 182-y into analog reference signal V− depending in part upon the state of the event-signal output of analog comparator 180-y. As noted analog comparator 180-y compares the analog reference signal V− to the analog sensor signal V+. The event-signal output of comparator 180-y is either ON or OFF depending upon the analog signals being compared.

In general, the event-signal output of comparator 180-y is ON if analog sensor signal V+ is greater than analog reference signal V−, and OFF if V+ is less than V−. If V+ and V− are within about 1 millivolts equal, the output of comparator 180-y could be indeterminate. Analog comparators, such as 180-y shown in FIG. 13, are much like OpAmps, but OpAmps provide a continuous output V out=G(V+−V−), whereas analog comparators saturate, that is, output an OFF or ON signal. An ideal comparator, like an ideal OpAmp, has infinite input impedance. That means that it observes the voltage at its input while allowing no current flow. Real comparators are pretty close to this ideal. An ideal comparator has zero output impedance. That means, when it drives its output to ON, it will maintain this output signal regardless of how much current it has to sink in order to do so. If real comparators are forced to sink too much current they may burn up, but the output voltage will not rise more than 100 millivolts or so.

Because the output of comparator 180-y may be indeterminate when the input signals V− and V+ are within 1 millivolt of being equal, a hysteresis ban can be added to analog comparator 180-y. With the hysteresis ban comparator 180-y, has two important thresholds: the analog equivalents of ViL-y and ViH-y. Unlike a simple comparator, however, the output of comparator 180-y does not depend solely on whether analog sensor signal V+ is above or below one of these thresholds (i.e., the analog equivalents of ViL-y and ViH-y). It depends on both the current state of the event-signal output and the current value of the sensor signal V+. If the event-signal output is ON, it will stay ON until the sensor signal V+ drops below the lower threshold (i.e, the analog equivalent of ViL-y). If the event-signal output is OFF, it will stay OFF until the V+ rises above the high threshold (i.e, the analog equivalent of ViH-y).

ASC circuit 33-*y* shown in FIG. 13 also includes an ASC control circuit 192-*y* coupled between pass circuits 194-*y* and 196-*y*. In one embodiment, each of the pass circuits 194-*y* and 196-*y* may take form in a simple transistor. The inputs of pass circuits 194-*y* and 196-*y* are coupled to the outputs of comparator 180-*y* and a programmable register 200-*y*, respectively, while the outputs of pass circuits 194-*y* and 196-*y* are coupled to event-signal bus 70 and event-ID bus 72, respectively.

ASC circuits 33 including that shown in FIG. 13 are configured, in one embodiment, to concurrently transmit their event-signal and event-ID onto event-signal bus 70 and event-ID bus 72, respectively, when given permission by event bus controller 38 (not shown in FIG. 13). In other words, ASC control circuit 192-*y* generates a pass signal when ASC control circuit 192-*y* receives permission from event-bus controller 38 via command bus 74 that contains an ASC identifier that matches the identifier stored within programmable register 202-*y*. Pass circuit 194-*y* passes the event-signal output of comparator 180-*y* onto event-signal bus 70, and pass circuit 196-*y* passes the event-ID stored within register 200-*y* to event ID bus 72 when they receive the pass signal from ASC control circuit 192-*y*. The event-signal passed onto event-signal bus 72 is the output of comparator 180-*y* at the time when ASC circuit 33-*y* receives permission. In one embodiment, event-signal bus 70 and event-ID bus 72 operate in a round robin fashion in which timer circuits 30 and ASC circuits 33 transmit their respective event-signal/event-ID pairs, regardless of event-signal state, in sequential order beginning with timer circuit 30-1 and ending with ASC circuit 33-*k*.

Example Control Signal

Returning to FIG. 1, control system 10 can generate control signals, such as the spark and fuel signals, as a function of event-signals generated by timer circuits 30. Importantly, event-signals can be generated by the timer circuits 30 after they are programmed by CPU 40.

FIG. 13 illustrates timer circuits and an I/O circuit configured to generate an example spark signal for controlling coil circuit 16. More particularly, FIG. 13 shows I/O circuit 32-1, which is programmed to generate a spark signal using event-signal ES-1 of timer circuit 30-1. FIG. 13 also shows timer circuits 30-2-30-5, which are programmed to generate event-signals ES-2-ES-5, respectively, that are subsequently used to control the event-signal ES-1 generated by timer circuit 30-1.

As shown, programmable memory devices 86-1-86-5 of timer circuits 30-1-30-5, respectively, store operational parameters calculated or selected by CPU 40. This Figure also shows registers of timer circuits 30-1-30-5 and I/O circuit 32-1 that store IE codes and event-IDs selected by CPU 40. SPARK is an event-ID that is stored in both event-ID register 78-1 of I/O circuit 32-1 and event-ID register 98-1 of timer circuit 30-1, and as a result I/O circuit 32-1 generates the spark signal as a function of event-signal ES-1 from timer circuit 30-1 using the process described with reference to FIG. 6.

The state of event-signal ES-1 depends on the state of match signal MS-1, which in turn depends on reference values transmitted on reference-bus 46. The state of the event-signal ES-1 may also depend on event-signals ES-2-ES-5 of timer circuits 30-2 through 30-5, respectively, as will be more fully described below. The state of event-signals ES-2-ES-5 may depend on the state of match signals MS-2-MS-5, which in turn depend on reference values transmitted on reference-bus 46. Lastly, the state of event-signals ES3-ES5 may depend on the state of event-signals ES-1 and ES-2.

Timer circuit 30-1 transmits its event-signal ES-1 and SPARK, the event-ID in register 94-1, whenever timer circuit 30-1 receives permission from event-bus controller 38. The state of event-signal ES-1 may be affected by event-signals ES-2-ES-5 from timer circuits 30-2-30-5. In timer circuit 30-1, IE code RST-H, which is mapped to the restart-on-assertion IE command (see e.g., Table 1 above), is stored in IE code register 94-1-0. FIG. 13 also shows DDA is stored as an event-ID in both event-ID register 96-1-0 and event-ID register 98-2 of timer circuit 30-2, which means IE circuit 92-1-0 will assert the restart-on-assertion IE command in response to receiving event-signal ES-2 in the ON state from timer circuit 30-2 using the process described with reference to FIG. 11. IE code F-OFF-L, which is mapped to the force-OFF-on-termination IE command, is stored in IE code register 94-1-1. MxD is stored as an event-ID in both event-ID register 96-1-1 and event-ID register 98-3 of timer circuit 30-3, which means IE circuit 92-1-1 will assert the force-OFF-on-termination IE command in response to receiving event-signals ES-3 in the ON state, and event logic circuit 90-1 will send a force signal to ALU circuit 114-1 when IE circuit 92-1-1 terminates the assertion of the force-OFF-on-termination IE command in response to receiving the first event-signal ES-3 in the OFF state, if ES-1 is ON at that time. IE code PP, which is mapped to the postpone IE command, is stored in IE code register 94-1-2. MnD is stored as an event-ID in both event-ID register 96-1-2 and event-ID register 98-4 of timer circuit 30-4, which means IE circuit 92-1-2 will assert the postpone IE command in response to receiving event-signal ES-4 in the ON state from timer circuit 30-4. IE code F-OFF-L, which is mapped to the force-OFF-on-termination IE command, is stored in IE coder register 94-1-3. MxI is stored in both event-ID register 96-1-3 and event-ID register 98-5 of timer circuit 30-5, which means IE circuit 92-1-3 will assert the force-OFF-on-termination IE command in response to receiving event-signals ES-5 in the ON state, and event logic circuit 90-1 will send a force signal to ALU circuit 114-1 when IE circuit 92-1-3 terminates the assertion of the force-OFF-on-termination IE command in response to receiving the first event-signal ES-5 in the OFF state, if ES-1 is ON at that time. In general, the state of event-signal ES-1 equals the state of match signal MS-1 generated by reference match circuit 88-1; however event-signal ES-1 is independent of match signal MS-1, and perhaps different, when the postpone IE command is asserted by IE circuit 91-1-2.

Timer circuit 30-2 may transmit its event-signal ES-2 and DDA, the event-ID in register 94-2, when timer circuit 30-2 receives permission from event-bus controller 38. The S/C bit of line 2 in programmable memory device 86-2 is set to C for continuous, thus reference match circuit 88-2 should enter a loop state once it is started. During the loop state, MS-2, and thus ES-2 toggles ES-2 to ON each time the 720 angle reference value 720As is equal to or greater than 20, the absolute match value AMV-1 in programmable memory device 86-2. Event logic circuit 90-2, however, is configured in this example to transmit ES-2/DDA only once each time ES-2 toggles from OFF to ON. Because of this configuration, event logic circuit 90-1 transmits ES-2/DDA only once during each cycle of the 720 angle reference 720At, even though event logic circuit 90-1 may receive several permissions from event-bus controller 38 while ES-2 is ON. Thus, event logic circuit 90-2 simply ignores most of the permissions from event-bus controller 38. IE code ST-H, which is mapped to the start-on-assertion IE command, is stored in IE code register 94-2-0. FIG. 13 shows START is stored as an event-ID in register 96-2-0. For purposes of explanation only, event-bus controller 38, when instructed, concurrently transmits an event-signal set to ON and event-ID=START to timer circuits 30 via event-signal bus 70 and event-ID bus 72, respectively. Thus, reference match circuit 88-2 begins operating in accordance with the process shown in FIG. 9 when IE circuit 92-1-0 concurrently receives the event-signal set to ON and event-ID=START from event-bus controller 38.

Timer circuit 30-3 transmits its event-signal ES-3 and MxD, the event-ID in register 94-3, whenever timer circuit 30-3 receives permission from event-bus controller 38. The state of event-signal ES-3 may be affected by event-signals ES-1 and ES-2 of timer circuits 30-1 and 30-2, respectively. IE code RST-H, which is mapped to the restart-on-assertion IE command, is stored in IE code register 94-3-0. DDA is stored as an event-ID in both event-ID register 96-3-0 and event-ID register 98-2 of timer circuit 30-2, which means IE circuit 92-3-0 will assert the restart-on-assertion IE command in response to receiving event-signal ES-2 in the ON state from timer circuit 30-2. IE code F-H, which is mapped to the force-on-assertion IE command, is stored in IE code register 94-3-1. SPARK is stored as an event-ID in both event-ID register 96-3-1 and event-ID register 98-1 of timer circuit 30-1, which means IE circuit 92-3-1 will assert the force-on-assertion IE command in response to receiving event-signals ES-1 in the ON state.

Timer circuit 30-4 transmits its event-signal ES-3 and MnD, the event-ID in register 94-4, whenever timer circuit 30-4 receives permission from event-bus controller 38. The state of event-signal ES-4 may be affected by event-signals ES-1 and ES-2 from timer circuits 30-1 and 30-2, respectively. IE code RST-H, which is mapped to the restart-on-assertion IE command, is stored in IE code register 94-4-0. DDA is stored as an event-ID in both event-ID register 96-4-0 and event-ID register 98-2 of timer circuit 30-2, which means IE circuit 92-4-0 will assert the restart-on-assertion IE command in response to receiving event-signal ES-2 in the ON state from timer circuit 30-2. IE code F-H, which is mapped to the force-on-assertion IE command, is stored in IE code register 94-4-1. SPARK is stored as an event-ID in both event-ID register 96-4-1 and event-ID register 98-1 of timer circuit 30-1, which means IE circuit 92-4-1 will assert the force-on-assertion IE command in response to receiving event-signals ES-1 in the ON state.

Timer circuit 30-5 transmits its event-signal ES-5 and MxI, the event-ID in register 94-3, whenever timer circuit 30-5 receives permission from event-bus controller 38. As an aside, event-signal ES-5 will toggle OFF when V1s, which represents the current flowing into coil 16, is equal to or greater than 3. The state of event-signal ES-5 may be affected by event-signals ES-1 and ES-2 from timer circuits 30-1 and 30-2, respectively. In timer circuit 30-5, IE code RST-H, which is mapped to the restart-on-assertion IE command, is stored in IE code register 94-5-0. DDA is stored as an event-ID in both event-ID register 96-5-0 and event-ID register 98-2 of timer circuit 30-2, which means IE circuit 92-5-0 will assert the restart-on-assertion IE command in response to receiving event-signal ES-2 in the ON state from timer circuit 30-2. IE code F-H, which is mapped to the force-on-assertion IE command, is stored in IE code register 94-5-1. SPARK is stored as an event-ID in both event-ID register 96-5-1 and event-ID register 98-1 of timer circuit 30-1, which means IE circuit 92-5-1 will assert the force-on-assertion IE command in response to receiving event-signals ES-1 in the ON state.

Figure 14A:
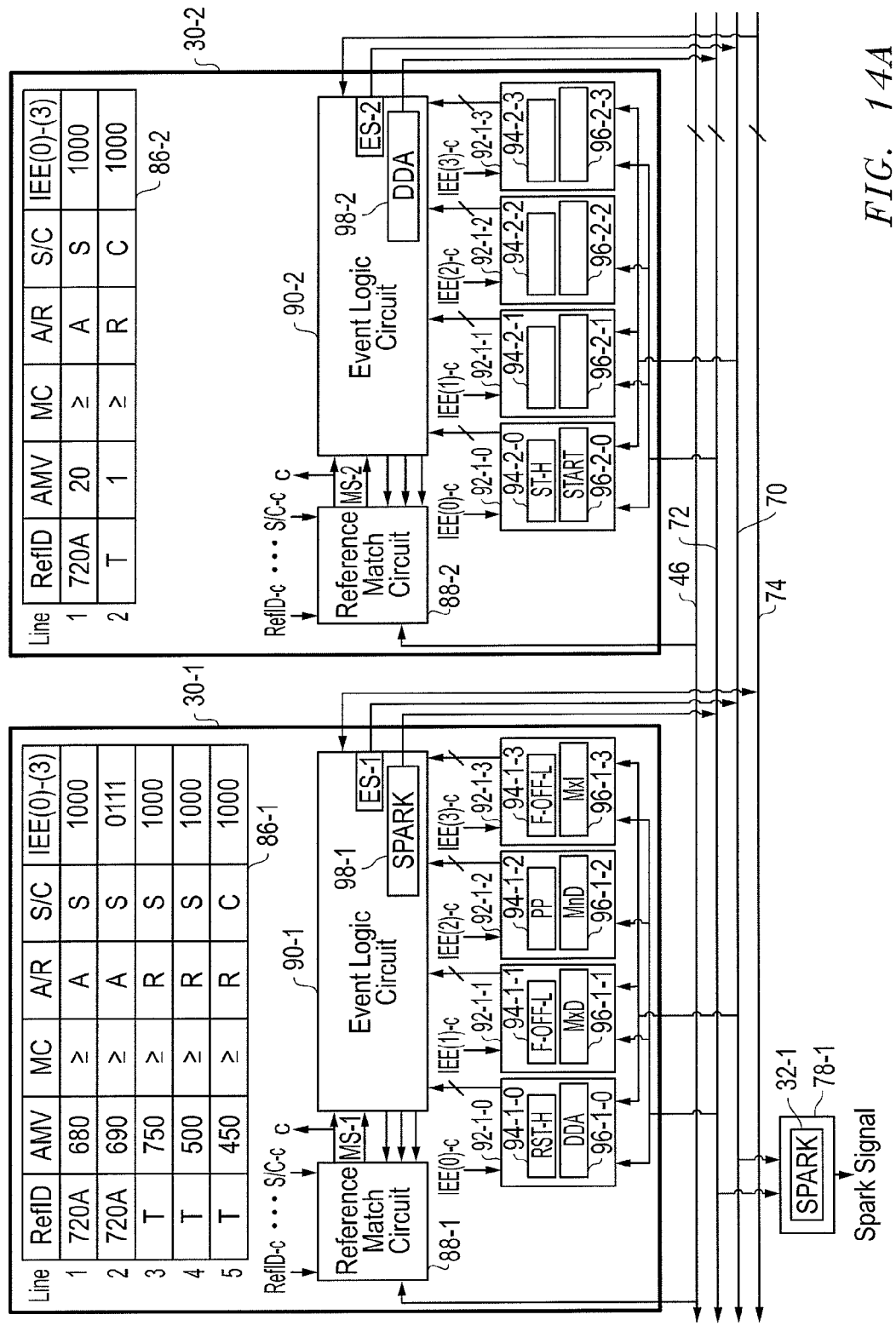
FIG. 14 illustrates timer and I/O circuits employed in the control system shown in FIG. 1, which are configured to generate an example spark signal.
Figure 14B:
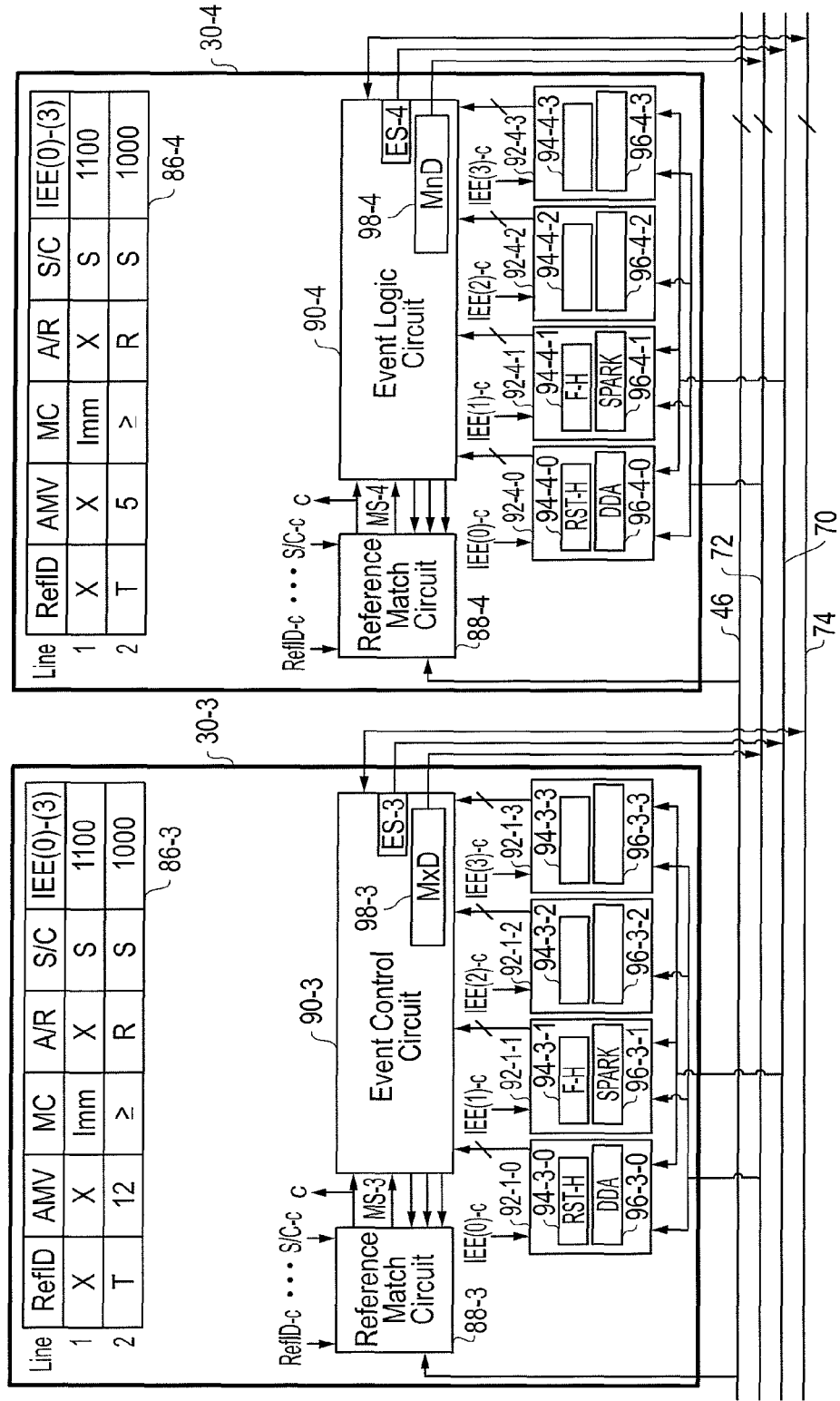
Figure 14C:
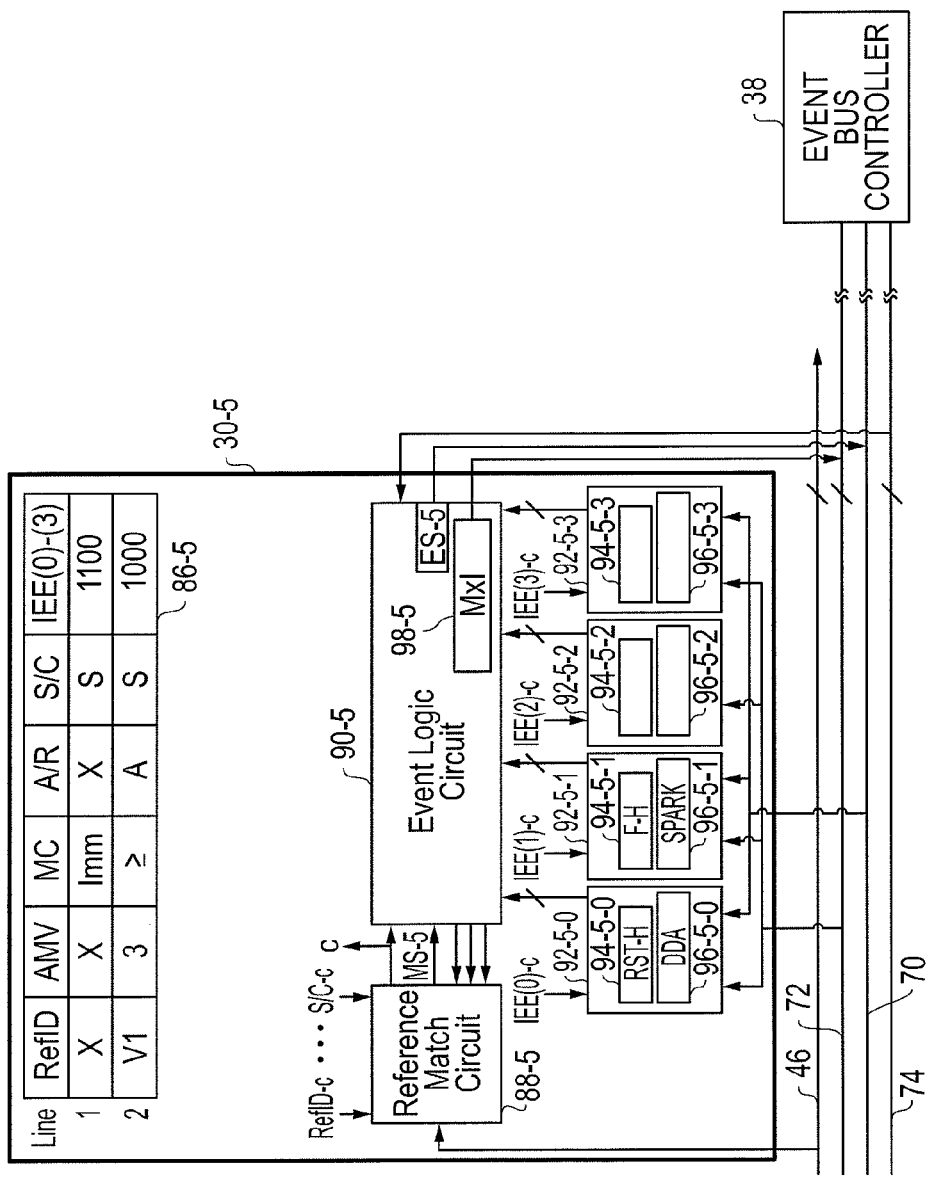

FIG. 14 shows timing diagrams of the event-signals and example spark signal that are generated by the timer circuits 30-1-30-5 and I/O circuit 32-1 of FIG. 13. The timing diagrams presume that event-bus controller 38, at time t0 (not shown), concurrently sends an event-signal set to ON and event-ID START to each of the timer circuits 30 shown in FIG. 13. At time t0, IE circuit 94-2-0 of timer circuit 30-2, asserts the start-on-assertion IE command, and reference match circuit 88-2, begins operating in accordance with the process shown in FIG. 9. At time t1, reference value 720As is received on reference-bus 46 and is equal to or greater than 20, the absolute match value AMV-1 in programmable memory device 86-2. Accordingly, reference match circuit 88-2 asserts match signal MS-2 in the ON state for a short time. Since event-signal ES-2 is presumed equal to match signal MS-2, event-signal ES-2 also toggles ON as shown at time t1. Shortly after time t1, timer circuit 30-2 transmit ES-2=ON and DDA to the other timer circuits after receiving permission. Event-ID registers 96-1-0 and 96-3-0-96-5-0 store DDA, the event ID as stored in register 98-2. As a result, IE circuits 92-1-0 and 92-3-0-92-4-0 assert their respective restart-on-assertion IE commands when they receive ES-2=ON, and reference match circuits 88-1 and 88-3-88-5 begin operating in accordance with the process shown in FIG. 9.

At time t2, reference match circuit 88-1 receives reference value 720As, which is equal to or greater than 680, the absolute match value AMV-1 of programmable memory device 86-1. As a result, reference match circuit 88-1 toggles match signal MS-1 to ON, and since event-signal ES-1 is presumed equal to match signal MS-1, ES-1 toggles to ON as shown in FIG. 14. Very soon thereafter, timer circuit 30-1 receives transmit-permission from event-bus controller 38, and timer circuit 30-1 transmits ES-1=ON and SPARK to timer circuits 30-2-30-5 and I/O circuit 32 via event-signal bus 70 and event-ID bus 72, respectively.

Since SPARK is stored in event-ID register 78-1 of I/O circuit 32-1, the spark signal transitions to ON shortly after time t2 as shown in FIG. 14. Because SPARK is stored as an event-ID in registers 96-3-1-96-5-1 of IE circuits 92-3-1-92-5-1, respectively, these IE circuits assert their force-on-transition IE commands, which in turn causes event logic circuits 90-3-90-5 send force signals to reference match circuits 88-3-88-5, respectively. The match conditions MC-1 in programmable memory devices 86-3-86-5 are set to "immediate," and accordingly reference match circuits 88-3-88-5 toggle their match signals MS-3-MS-5, respectively, to ON when they receive the force signals. Because event-signal ES-3-ES-5 are presumed equal to match signals MS-3-MS-5, respectively, event-signals ES-3-ES-5 also toggle to ON shortly after time t2 as shown. When they are given permission by event-bus controller 38, timer circuit 30-3 transmits ES-3=ON and MxD to all other timer circuits, including timer circuit 30-1, timer circuit 30-4 transmits ES-4=ON and MxD to all other timer circuits, including timer circuit 30-1, and timer circuit 30-5 transmits ES-5=ON and MxI to all other timer circuits, including timer circuit 30-1. When IE circuits 96-1-1-96-1-3 first receive ES-3-ES-5, respectively, in the ON state, along with event-IDs MxD, MnD, and MxI, respectively, IE circuits 96-1-1 and 96-1-3 assert the force-OFF-on-termination IE command, and IE circuit 96-1-2 asserts the postpone IE command.

At time t3, reference match circuit 88-4 receives reference value Ts, which is equal to or greater than RMV=Tm+5, where 5 is the absolute match value AMV-2 in programmable memory device 86-4. As a result, MS-4 and ES-4 toggle to OFF as shown in FIG. 14. Shortly thereafter, timer circuit 30-4 transmits MnD and ES-4=OFF to the timer circuits, including timer circuit 30-1, when given permission by event-bus controller 38. Shortly after time t3 IE circuit 92-1-2 receives ES-4 in the OFF state, and IE circuit 92-1-2 terminates the assertion of its postpone IE command as shown in FIG. 14.

At time t4, reference match circuit 88-1 receives reference value 720As that equals or is greater than 690, the absolute match value AMV-2 in programmable memory device 86-1. As a result, the reference match circuit 88-1 toggles match signal MS-1 to OFF at that time. Since the postpone IE command is no longer asserted, event-signal ES-1 also toggles to OFF as shown in FIG. 14. Shortly thereafter, timer circuit 30-1 transmits ES-1=OFF and SPARK to the other timer circuits and to I/O circuit 32-1 via event-signal bus 70 and event-ID bus 72, respectively. Since SPARK is stored in the event-ID register 78-1, the spark signal transitions to OFF shortly after time t4 as shown in FIG. 14.

At time t5, reference match circuit 88-3 receives reference value Ts, which is equal to or greater than RMV=Tm+12, where 12 is the absolute match value AMV-2. As a result both MS-3 and ES-3 toggle to OFF. Shortly thereafter, timer circuit 30-3 receives permission from event-bus controller 38 and subsequently transmits event-signal ES-3=OFF and MxD to the timer circuits, including timer circuit 30-1. MxD is stored in event-ID register 96-1-1. Accordingly, when IE circuit 92-1-1 receives event-signal ES-3=OFF, IE circuit 92-1-1 terminates assertion of its force-OFF-on termination IE command. If event-signal ES-1 was still ON, event logic circuit 90-1 would've issued the force signal, which would've resulted in event-signal ES-1 toggling to OFF. However, since event-signal ES-1 was OFF, event logic circuit 90-1 did not send a force signal to reference match circuit 88-1.

At time t7, reference match circuit 88-1 receives reference value Ts that equals or is greater than 750, the absolute match value AMV-3 in programmable memory device 86-1. Because MC-3 is set to "greater than or equal to," both match signal MS-1 event-signal ES-1 toggle to ON as shown in FIG. 14. Shortly thereafter, timer circuit 30-1 sends ES-1=ON and SPARK to the other timer circuits 30-2 through 30-5 and I/O circuit 32-1. Even though SPARK is stored in event-ID registers 96-3-1 through 96-5-1, transition of event-signal ES-1 to ON will have no effect on timer circuits 30-3 through 30-5 since reference match circuits 88-3 through 88-5 are no longer operating according to the process of FIG. 9. However, I/O circuit 32-1 will transition its spark signal to ON since event-ID registers 78-1 contains the SPARK event-ID.

At time t8, reference match circuit 88-1 receives reference value Ts equal to 500, the absolute match value AMV-4 in programmable memory device 86-1. Since MC-4 is set to "greater than or equal to," both match-signal MS-1 and thus ES-1 toggle to OFF as shown in FIG. 14. Shortly thereafter, timer circuit 30-1 transmits ES-1=OFF and SPARK to the other timer circuits and to I/O circuit 32-1. Timer circuits 30-2-30-5 are not affected by the transition of event-signal ES-1. However, I/O circuits 32-1 will toggle its spark signal as shown.

At time t9, reference match circuit 88-1 receives reference value Ts equal to or greater than 450, the absolute match value AMV-5. Since match condition MC-5 is set to "greater than or equal to," both match signal MS-1 and event-signal ES-1 toggle to ON as shown in FIG. 14. Shortly thereafter, event logic circuit 90-1 receives permission from event-bus controller 38, and subsequently transmits ES-1=ON and SPARK to the other timer circuits and to I/O circuit 32-1. Timer circuits 30-2-30-5 are unaffected by the transition of event-signal ES-1. I/O circuit 32-1, however, transitions its spark signal as shown in FIG. 14.

At this point, reference match circuit 88-1 has entered into a loop state in which it operates in accordance with the operational parameters in lines 4 or 5 of programmable memory device 86-1. Accordingly, match signal MS-1, and thus event-signal ES-1, toggle at times t10, t11, and t12, as shown in FIG. 14. These transitions are reflected in the spark signal output of I/O circuit 32-1.

Eventually at time t13, reference match circuit 88-2 receives reference value 720 equal to 20, the absolute match value AMV-1 of programmable memory device 86-2. Accordingly, both match signal MS-2 and event-signal ES-2 of timer circuit 30-2 transition to ON as shown. Shortly thereafter, event logic circuit 90-2 transmits ES-2=ON and DDA to the other timer circuits 30-1 and 30-3-30-5, which results in restart of reference match circuits 88-1 and 88-3-88-5.

Presuming reference match circuit 88-5 never received reference value V1s equal to or greater than AMV-2=3 before t13, neither MS-5 nor ES-5 toggle to OFF before t13 as shown. However, both MS-5 and ES-5 toggle OFF in response to reference match circuit 88-5 restarting. Shortly thereafter, timer 30-5 receives permission from event-bus controller 38, and timer circuit 30-5 transmits ES-5=OFF and MxI to the other timer circuits, including timer circuit 30-1. Event-ID register 96-1-3 stores MxI. When IE circuit 92-1-3 receives event-signal ES-5=OFF state, IE circuit 92-1-3 terminates the assertion of its force-OFF-on-termination IE command. If event-signal ES-5 was in the ON state, event logic circuit 90-1 would've sent a force signal to reference match circuit 88-1. However event-signal ES-1 was in the OFF state at t13, and event logic circuit 90-1 did not send a force signal when IE circuit 92-1-3 terminated assertion of its force-OFF-on-termination IE command.

Figure 15:
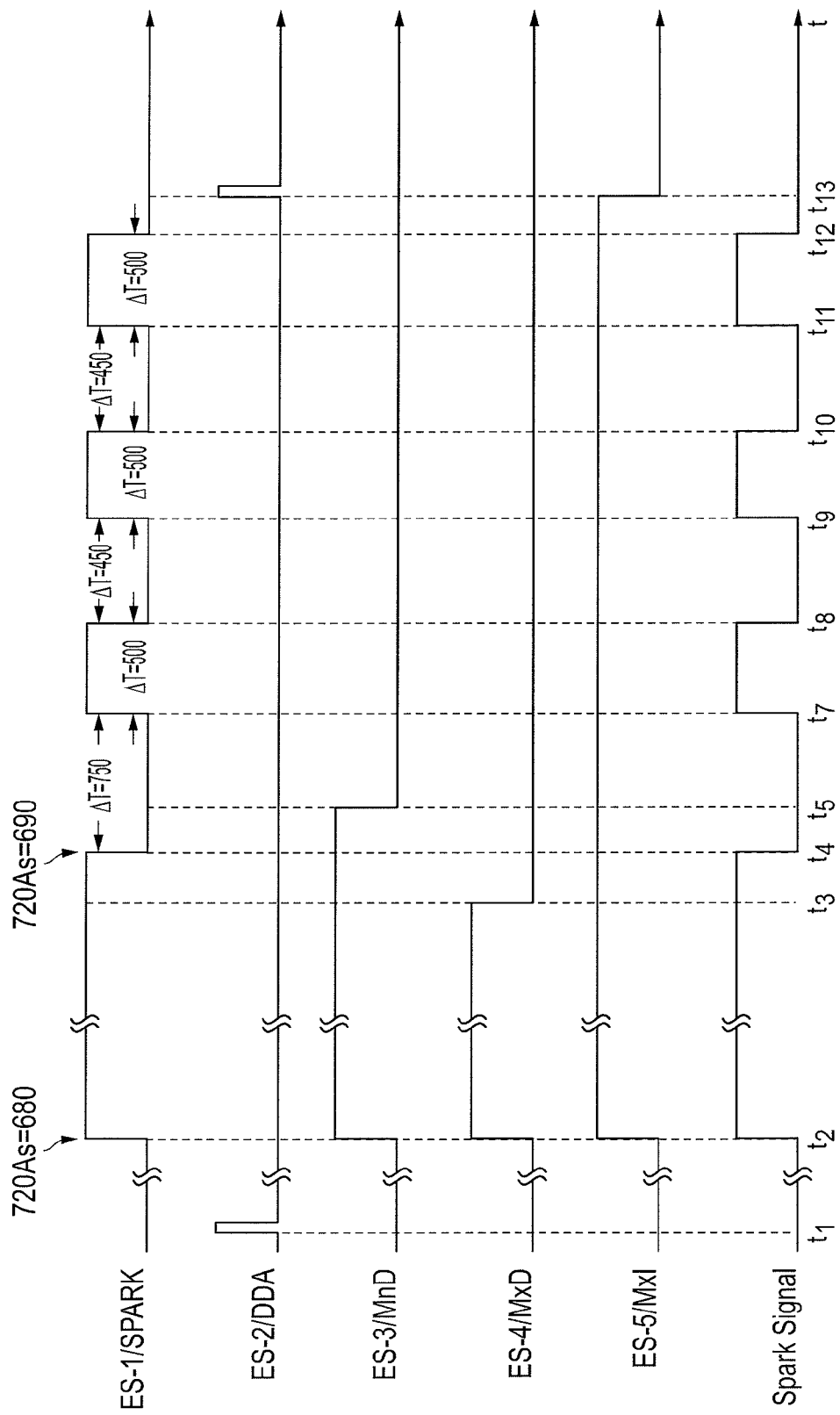
FIG. 15 illustrate example timing diagrams for the event-signals and spark signal that are generated by the timer and I/O circuits shown in FIG. 13.

FIGS. 14 and 15 and the description thereof, explain how control system 10 can generate a control signal such as the example spark signal using timer circuits 30. The state of the example spark signal depends on event-signal ES-5 that is generated by timer circuit 30-5. If ES-5 switches from OFF to ON, the example spark signal should switch to OFF if it is in the ON state. As described above, timer circuit 30-5 switches ES-5 to ON when reference value V1t, the digital representation of the current flowing into coil 16 (See FIG. 1) is greater than or equal to 3, the value of AMV in line 2 of programmable memory device 86-5.

Some control signals, such as the example spark signal, can be generated based on the event-signals generated by one or more timer circuits 30. Control signals can also be generated based on event-signals generated by a combination of one or more timer circuits 30 and one or more ASC circuits 33. To illustrate, an ASC circuit 33 can be programmed to provide the same or similar function that is provided by example timer circuit 30-5 of FIG. 14. The example spark signal generated in FIG. 14 can also be generated with timer circuit 30-5 functionally replaced by a programmed ASC circuit 33, such as ASC circuit 33-1 shown in FIG. 16 more fully described below.

Figure 16:
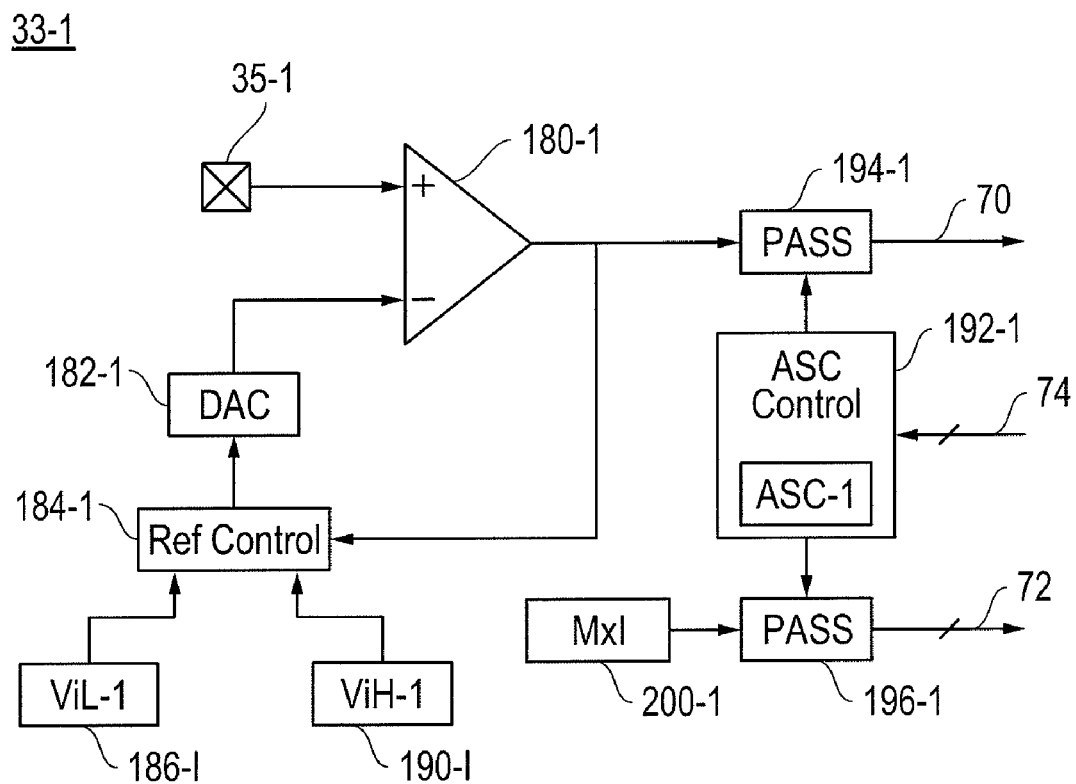
FIG. 16 illustrates relevant components of an example analog comparator that could be used in instead of one of the timer circuits shown in FIG. 14.

FIG. 16 illustrates relevant components of example ASC circuit 33-1 that has been programmed by CPU 40 with ViL-1=3 and ViH-1=2.8, circuit ID=ASC-1, and event-ID=MxI. As noted, ASC circuit 33-1 provides an interrupt function that is similar to the interrupt function provided by timer circuit 30-5 of FIG. 14. In FIG. 16, I/O pad 35-1 is coupled to the output of current sensor 20 (see FIG. 1) and configured to receive the analog signal that is proportional to the charging current I provided to coil 16.

When ASC control circuit 192-1 receives permission from event-ID bus controller 38, ASC circuit 192-1 instructs pass circuits 194 and 196 to pass the event-signal output of comparator 180-1 and the event-ID in register 200-1 onto event-signal bus 70 and event-ID bus 72, respectively. In other words, pass circuit 194-1 will output as event-signal ES-5 of comparator circuit 180-1, and pass circuit 196-1 will output event-ID equal to MxI stored within register 200-1 onto event bus 72. The state of ES-5 will depend upon the analog signals provided to the inputs of analog comparator 180-1.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

What is claimed is:

1. A method comprising:
   a comparator circuit receiving an analog reference signal and an analog input signal;
   the comparator circuit generating a first digital signal set to a first state if the analog reference signal is greater in magnitude than the analog input signal, or set to a second state if analog reference signal is lower in magnitude than the analog input signal;
   the comparator transmitting the first digital signal to a first circuit via a bus;
   the first circuit receiving the first digital signal via the bus;
   the first circuit generating a second digital signal set to the first or second state depending on whether the received first digital signal is set to the first or second state;
   a second circuit receiving the second digital signal.

2. The method of claim 1 wherein the second circuit receives the second digital signal via the bus.

3. The method of claim 1 further comprising:
   the first circuit receiving a first plurality of digital reference values via a second bus;
   the first circuit selecting a digital reference value from the first plurality;
   the first circuit comparing the selected digital reference value to a first digital match value.

4. The method of claim 3 further comprising the first circuit switching the state of the second digital signal if the first digital match value compares equally to or is less than the selected digital reference value.

5. The method of claim 4 further comprising the first circuit switching the state of second digital signal when the first comparator switches the state of the first digital signal while the second digital signal is in the second state.

6. The method of claim 1 further comprising:
   a processor generating a multibit digital reference value as a function of one or more digital input values;
   a digital-to-analog (DAC) convertor converting the multibit digital reference value into the analog reference signal.

7. The method of claim 1 further comprising a sensor generating the analog input signal as a function of electrical current flowing into a device, wherein the analog input signal changes over time.

8. The method of claim 1 further comprising:
   another comparator circuit receiving a second analog reference signal and a second analog input signal;
   the other comparator circuit generating a third digital signal set to the first state if the second reference analog signal is greater in magnitude than the second analog input signal, or set to the second state if second analog reference signal is less in magnitude than the second analog input signal;
   the other comparator transmitting the third digital signal to the first circuit via the bus;
   the first circuit receiving the third digital signal via the bus;
   wherein the state of the second digital signal depends on the state of the received third digital signal;
   wherein the analog reference signal and the second analog reference signal are unequal.

9. The method of claim 1 further comprising an act of transmitting a first multibit digital identification signal that corresponds to the first digital signal, wherein the first multibit digital identification signal and the first digital signal are transmitted at the same time.

10. The method of claim 1 further comprising:
    transmitting a first multibit digital identification signal that corresponds to the first digital signal, wherein the first multibit digital identification signal and the first digital signal are transmitted at the same time;
    the first circuit transmitting a second multibit digital identification signal that corresponds to the second digital signal, wherein the second multibit digital identification signal and the second digital signal are transmitted at the same time;
    wherein the first and second digital signals are transmitted at different times via the bus.

11. An apparatus comprising:
    first and second circuits coupled together via a bus;
    an input pin configured to receive an analog input signal;
    a digital-to-analog (DAC) convertor configured to convert a multibit reference signal into an analog reference signal;
    a comparator circuit coupled to the bus, an output of the DAC and to the input pin, wherein the comparator circuit is configured to receive the analog reference signal from the DAC and the analog input signal, wherein the comparator circuit is configured to generate a first digital signal set to a first state if the analog reference signal is greater in magnitude than the analog input signal, or set to a second state if analog reference signal is lower in magnitude than the analog input signal, and wherein the comparator circuit is configured to transmit the first digital signal to the first circuit via the bus;
    wherein the first circuit is configured to receive the first digital signal;
    wherein the first circuit is configured to generate a second digital signal set to the first or second state depending on whether the received first digital signal is set to the first or second state;
    wherein the second circuit is configured to receive the second digital signal from the first circuit via the bus.

12. The apparatus of claim 11 further comprising:
    a second bus;
    wherein the first circuit is configured to receive a first plurality of digital reference values via a second bus;
    wherein the first circuit is configured to select a digital reference value from the first plurality;
    wherein the first circuit is configured to compare the selected digital reference value to a first digital match value.

13. The apparatus of claim 12 wherein the first circuit is configured to switch the state of the second digital signal if the first digital match value compares equally to or is less than the selected digital reference value.

14. The apparatus of claim 3 wherein the first circuit is configured to switch the state of second digital signal when the first comparator switches the state of the first digital signal while the second digital signal is in the second state.

15. The apparatus of claim 11 further comprising a processor configured to generate the multibit digital reference value as a function of one or more digital input values.

16. The apparatus of claim 11 further comprising a sensor configured to generate the analog input signal as a function of electrical current flowing into a device.

17. The apparatus of claim 11 further comprising:
a second input pin configured to receive a second analog input signal;
a second digital-to-analog (DAC) convertor configured to convert a second multibit reference signal into a second analog reference signal;
a second comparator circuit coupled to the bus, an output of the second DAC and to the second input pin, wherein the second comparator circuit is configured to receive the second analog reference signal from the second DAC and the second analog input signal, wherein the second comparator circuit is configured to generate a third digital signal set to the first state if the second analog reference signal is greater in magnitude than the second analog input signal, or set to the second state if second analog reference signal is lower in magnitude than the second analog input signal, and wherein the second comparator circuit is configured to transmit the third digital signal to the first circuit via the bus;
wherein the first circuit is configured to receive and process the third digital signal;
wherein the first circuit is configured to generate the second digital signal set to the first or second state depending on whether the received third digital signal is set to the first or second state.

18. The apparatus of claim 11 further comprising:
a memory for storing a first multibit digital identification signal that corresponds to the first digital signal, and;
a circuit for generating a command to simultaneously transmit the first multibit digital identification signal and the first digital signal.

19. The apparatus of claim 11 further comprising:
a first memory for storing a first multibit digital identification signal that corresponds to the first digital signal;
a first circuit for generating a command to simultaneously transmit the first multibit digital identification signal and the first digital signal a second memory storing a second multibit digital identification signal that corresponds to the second digital signal;
wherein the first circuit is configured to transmit the second multibit digital identification signal and the second digital signal at the same time.

* * * * *